US012575188B2

(12) United States Patent
Ku et al.

(10) Patent No.: US 12,575,188 B2
(45) Date of Patent: *Mar. 10, 2026

(54) INTEGRATED CIRCUIT AND METHOD OF FORMING THE SAME

(71) Applicant: TAIWAN SEMICONDUCTOR MANUFACTURING COMPANY, LTD., Hsinchu (TW)

(72) Inventors: Chun-Yao Ku, Hsinchu (TW);
Wen-Hao Chen, Hsinchu (TW);
Kuan-Ting Chen, Hsinchu (TW);
Ming-Tao Yu, Hsinchu (TW);
Jyun-Hao Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/739,703

(22) Filed: Jun. 11, 2024

(65) Prior Publication Data

US 2024/0332280 A1      Oct. 3, 2024

Related U.S. Application Data

(60) Continuation of application No. 18/190,703, filed on Mar. 27, 2023, now Pat. No. 12,009,356, which is a
(Continued)

(51) Int. Cl.
*G06F 30/30* (2020.01)
*G06F 30/20* (2020.01)
(Continued)

(52) U.S. Cl.
CPC ............. *H10D 89/10* (2025.01); *G06F 30/20* (2020.01); *G06F 30/392* (2020.01);
(Continued)

(58) Field of Classification Search
CPC ...... H10D 89/10; H10D 30/43; H10D 62/121; H10D 84/0193; H10D 84/038;
(Continued)

(56) References Cited

U.S. PATENT DOCUMENTS 7,096,448 B2 * 8/2006 Teig ...................... G06F 30/394
716/129
7,260,442 B2 8/2007 Hwang et al.
(Continued)

FOREIGN PATENT DOCUMENTS

CN       109786369       5/2019
DE       102019125900    4/2020
(Continued)

*Primary Examiner* — Jack Chiang
*Assistant Examiner* — Brandon Bowers
(74) *Attorney, Agent, or Firm* — Hauptman Ham, LLP

(57) ABSTRACT

An integrated circuit includes a first region of the integrated circuit including a first set of pins extending in a first direction, being on a first level, and having a first width in a second direction different from the first direction. The first region has a first height in the second direction. An integrated circuit further includes a second region of the integrated circuit adjacent to the first region, the second region including a second set of pins extending in the first direction, being on a first level, being separated from the first set of pins in the second direction, and having a second width in the second direction, the first width being different from the second width. The second region has a second height in the second direction different from the first height, and the first level is a first metal layer of the integrated circuit.

20 Claims, 14 Drawing Sheets

700

702 — Generate or place a set of active region layout patterns

704 — Generate or place a set of gate layout patterns

706 — Generate or place a set of contact layout patterns

708 — Generate or place a first set of gridlines

710 — Generate or place a first set of conductive feature layout patterns

712 — Generate or place a first set of via layout patterns

714 — Generate or place a second set of gridlines

716 — Generate or place a second set of conductive feature layout patterns

718 — Generate or place a second set of via layout patterns

720 — Generate or place a third set of conductive feature layout patterns

Related U.S. Application Data division of application No. 17/095,149, filed on Nov. 11, 2020, now Pat. No. 11,616,055.

(60) Provisional application No. 62/968,022, filed on Jan. 30, 2020.

(51) Int. Cl.

| | |
|---|---|
| *G06F 30/392* | (2020.01) |
| *H01L 23/538* | (2006.01) |
| *H10D 89/10* | (2025.01) |
| *H10K 30/83* | (2023.01) |

(52) U.S. Cl.
CPC ...... *H01L 23/5386* (2013.01); *H01L 23/5387* (2013.01); *H10K 30/83* (2023.02)

(58) Field of Classification Search
CPC ............... H10D 84/853; H10D 84/975; H10D 84/0158; H10D 84/834; G06F 30/20; G06F 30/392; H01L 23/5386; H01L 23/5387; H10K 30/83; B82Y 10/00
See application file for complete search history.

(56) References Cited

U.S. PATENT DOCUMENTS

| | | | |
|---|---|---|---|
| 8,230,380 | B2 | 7/2012 | Penzes |
| 8,631,377 | B2 | 1/2014 | Lee et al. |
| 9,007,095 | B2 | 4/2015 | Penzes |
| 9,256,709 | B2 | 2/2016 | Yu et al. |
| 9,514,264 | B1 | 12/2016 | Nebersnyi |
| 9,727,683 | B2 | 8/2017 | Liu |
| 10,270,430 | B2 | 4/2019 | Guo et al. |
| 10,678,988 | B2 | 6/2020 | Correale, Jr. et al. |
| 10,685,982 | B2 | 6/2020 | Chou et al. |
| 10,769,342 | B2 | 9/2020 | Sio |
| 10,998,340 | B2 | 5/2021 | Guo et al. |
| 11,552,067 | B2 | 1/2023 | Gerousis |
| 2005/0001271 | A1* | 1/2005 | Kobayashi .......... H10D 84/907 |
| | | | 257/202 |
| 2014/0040838 | A1 | 2/2014 | Liu et al. |
| 2015/0278429 | A1 | 10/2015 | Chang |
| 2017/0344689 | A1* | 11/2017 | Basaran ................ G06F 30/392 |
| 2019/0155984 | A1 | 5/2019 | Chen |
| 2019/0392108 | A1 | 12/2019 | Hanchinal |

FOREIGN PATENT DOCUMENTS

| | | |
|---|---|---|
| TW | 200941263 | 10/2009 |
| TW | 201610734 | 3/2016 |
| TW | 201820397 | 6/2018 |
| TW | 201820538 | 6/2018 |

* cited by examiner

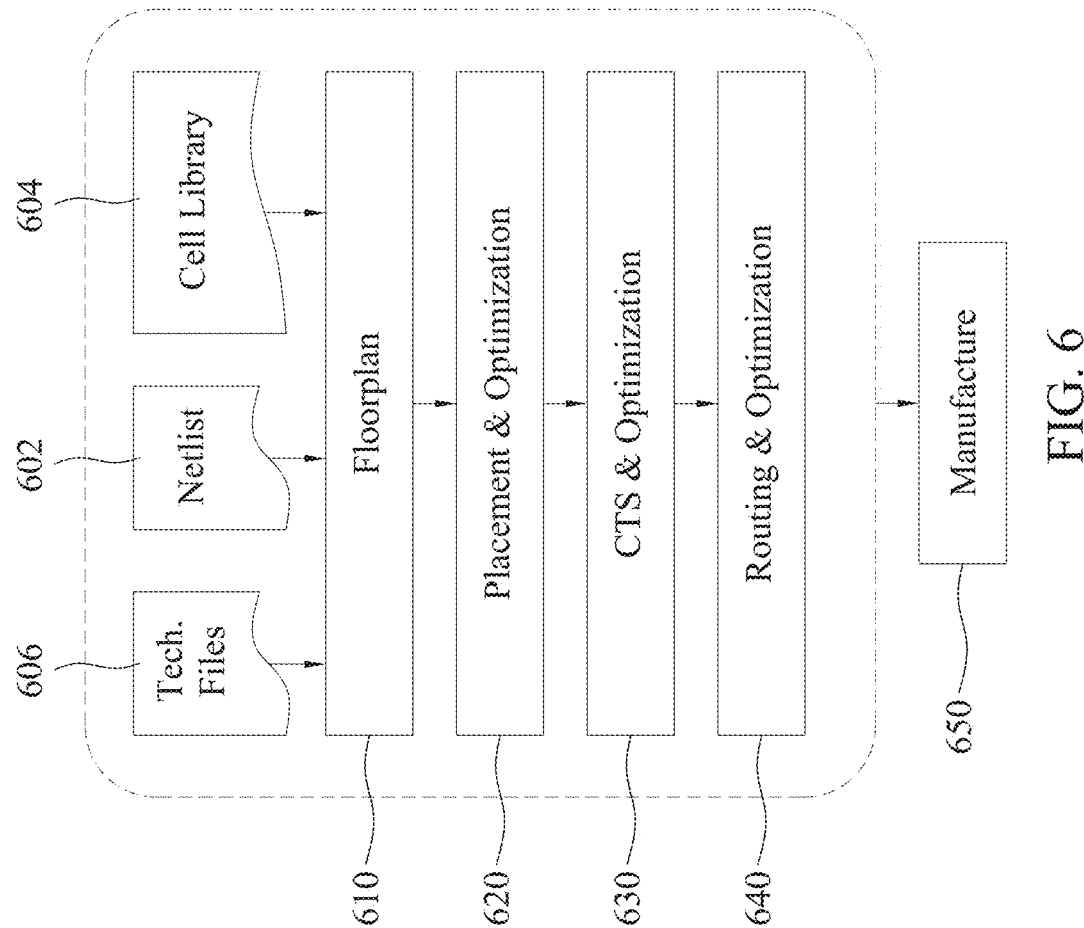
FIG. 6

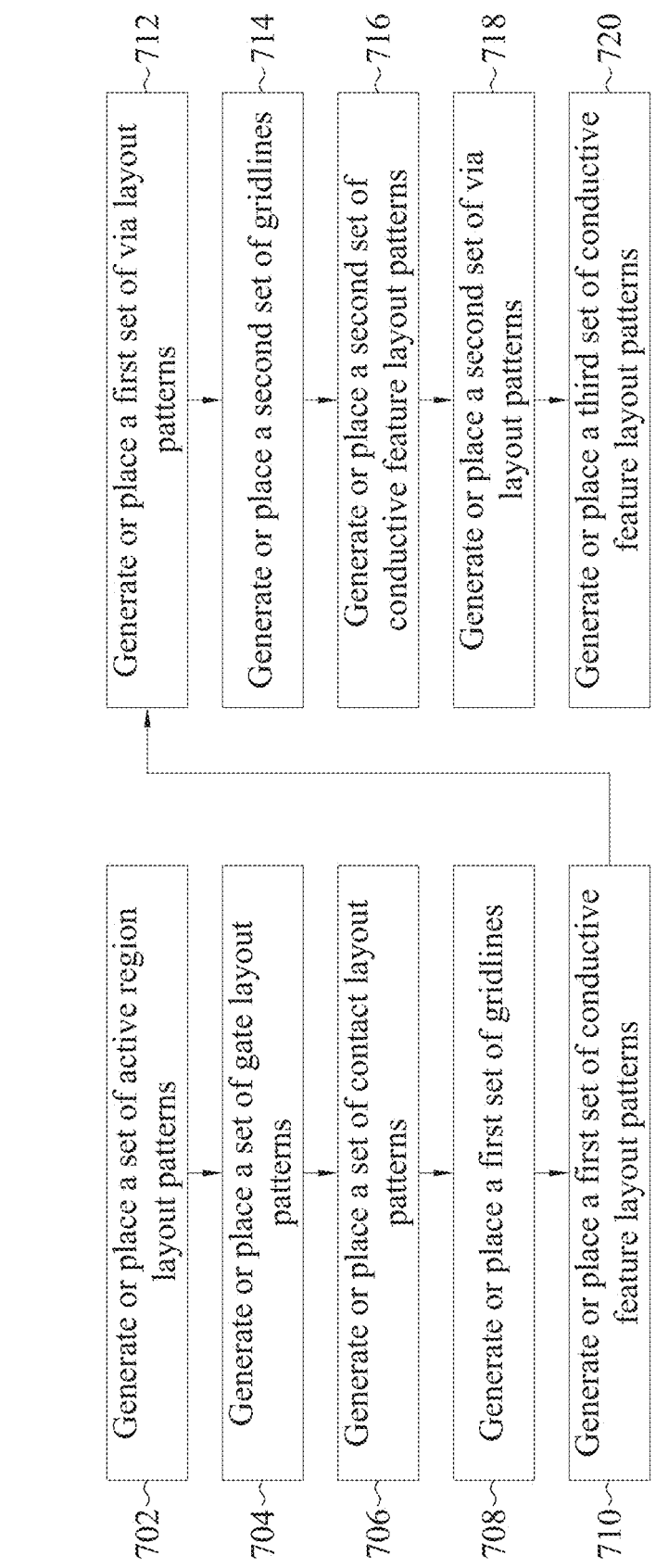

700

702 — Generate or place a set of active region layout patterns

704 — Generate or place a set of gate layout patterns

706 — Generate or place a set of contact layout patterns

708 — Generate or place a first set of gridlines

710 — Generate or place a first set of conductive feature layout patterns

712 — Generate or place a first set of via layout patterns

714 — Generate or place a second set of gridlines

716 — Generate or place a second set of conductive feature layout patterns

718 — Generate or place a second set of via layout patterns

720 — Generate or place a third set of conductive feature layout patterns

FIG. 7

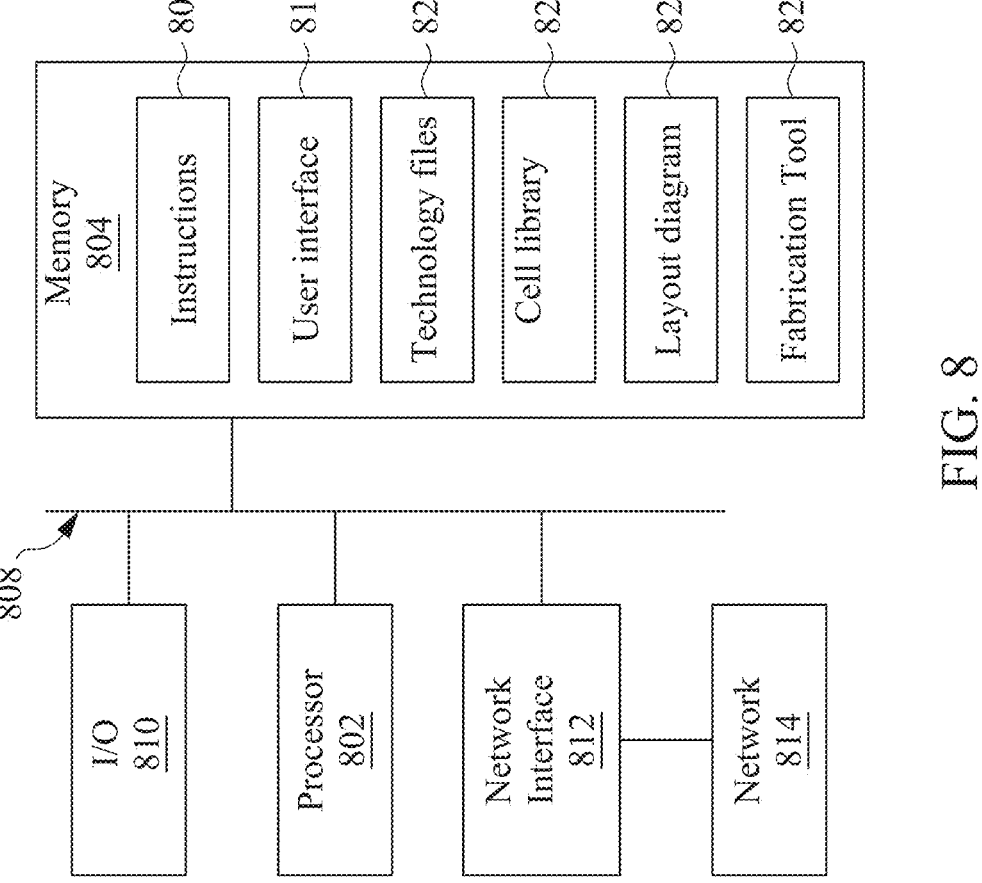
FIG. 8

INTEGRATED CIRCUIT AND METHOD OF FORMING THE SAME

PRIORITY CLAIM

The present application is a continuation of U.S. application Ser. No. 18/190,703, filed Mar. 27, 2023, now U.S. Pat. No. 12,009,356, issued Jun. 11, 2024, which is a divisional of U.S. application Ser. No. 17/095,149, filed Nov. 11, 2020, now U.S. Pat. No. 11,616,055, issued Mar. 28, 2023, which claims the benefit of U.S. Provisional Application No. 62/968,022, filed Jan. 30, 2020, which are herein incorporated by reference in their entireties.

BACKGROUND

The semiconductor integrated circuit (IC) industry has produced a wide variety of digital devices to address issues in a number of different areas. Some of these digital devices, such as level shifter circuits, are configured to enable operation of circuits capable of operation in different voltage domains. As ICs have become smaller and more complex, operating voltages of these digital devices continue to decrease affecting IC performance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a functional flow chart of at least a portion of an IC design and manufacturing flow, in accordance with some embodiments.

FIG. 7 is a flowchart of a method of generating a layout design of an integrated circuit, in accordance with some embodiments.

FIG. 8 is a schematic view of a system for designing an IC layout design and manufacturing an IC, in accordance with some embodiments.

DETAILED DESCRIPTION

Figure 1:
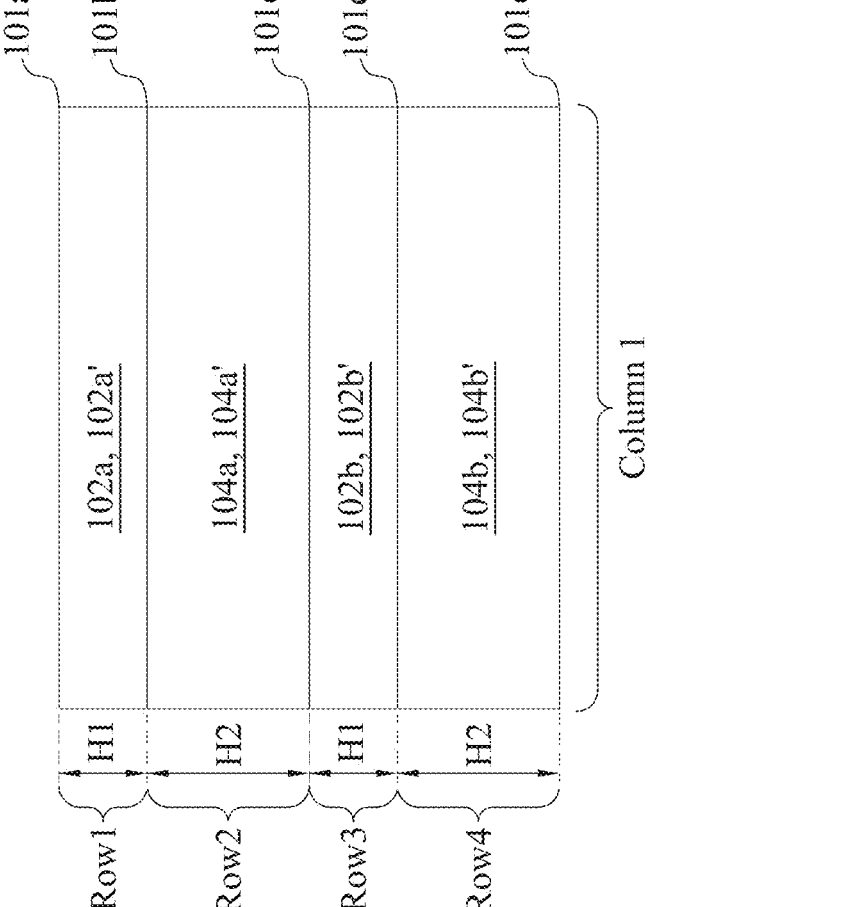
FIG. 1 is a diagram of a layout design, in accordance with some embodiments.

The following disclosure provides different embodiments, or examples, for implementing features of the provided subject matter. Specific examples of components, materials, values, steps, arrangements, or the like, are described below to simplify the present disclosure. These are, of course, merely examples and are not limiting. Other components, materials, values, steps, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an integrated circuit includes a first region and a second region adjacent to the first region. In some embodiments, the first region corresponds to a first standard cell, and the second region corresponds to a second standard cell. In some embodiments, the first standard cell has a first height. In some embodiments, the second standard cell has a second height different from the first height.

In some embodiments, the first and second standard cells are part of a hybrid standard cell approach where standard cells with different cell heights are placed adjacent to each other. In some embodiments, the second standard cells are configured to optimize the performance and speed of the integrated circuit. In some embodiments, the first standard cells are configured to optimize standard cell area, routability, pin-accessibility or power consumption of the integrated circuit.

In some embodiments, by using the hybrid standard cell approach where standard cells with the different cell heights and at least variable via dimensions, variable pin widths or variable metal pitches, a balance is reached in the layout design and corresponding integrated circuit such that the speed and performance of the standard cells is improved compared to other approaches, but the standard cell area, routability and pin-accessibility of the hybrid standard cells is at least similar to other approaches. In some embodiments, by having different cell heights and at least variable via dimensions, variable pin widths or variable metal pitches, the standard cells of the present disclosure are able to switch states fast enough in order to pass timing tests or timing violations, but also do not consume additional power by being overdesigned by having a driving current capability more than needed in order to pass timing tests and/or timing violations, and the standard cells of the present disclosure are able to maintain area, routability and pin-accessibility similar to other approaches.

FIG. 1 is a diagram of a layout design 100, in accordance with some embodiments. Layout design 100 is a layout diagram of an integrated circuit, such as integrated circuit 300A of FIG. 3A, 300B of FIG. 3B, 400B of FIG. 4B or 500B of FIG. 5B. Layout design 100 is usable to manufacture an integrated circuit, such as integrated circuit 300A (FIG. 3A), 300B (FIG. 3B), 400B (FIG. 4B) or 500B (FIG. 5B), in accordance with some embodiments.

Layout design 100A includes standard cell layout designs 102a, 102b, 104a and 104b. In some embodiments, layout design 100A includes additional elements not shown in FIG. 1.

Each of standard cell layout designs 102a, 102b, 104a and 104b extend in at least a first direction X. Each of standard cell layout designs 102a, 102b, 104a and 104b are separated from another of standard cell layout designs 102a, 102b, 104a and 104b in a second direction Y. In some embodiments, the second direction Y is different from the first direction X.

Standard cell layout design 102a has a cell boundary 101a that extends in a first direction X. In some embodiments, standard cell layout design 102a is adjacent in the first direction along the cell boundary 101a to other standard cell layout designs (not shown for ease of illustration).

Standard cell layout design 102a is adjacent to standard cell layout design 104a in the first direction X along a cell boundary 101b. Standard cell layout design 104a is adjacent to standard cell layout design 102b in the first direction X along a cell boundary 101c. Standard cell layout design 102b is adjacent to standard cell layout design 104b in the first direction X along cell boundary 101d.

Standard cell layout design 104b has a cell boundary 101e that extends in the first direction X. In some embodiments, standard cell layout design 104b is adjacent in the first direction along the cell boundary 101e to other standard cell layout designs (not shown for ease of illustration).

Other configurations or quantities of standard cell layout designs 102a, 102b, 104a and 104b are within the scope of the present disclosure. For example, layout design 100 of FIG. 1 includes one column (Column 1) and four rows (Rows 1-4) of cells (e.g., standard cell layout designs 102a, 102b, 104a and 104b). Other numbers of rows and/or columns in layout design 100 are within the scope of the present disclosure. For example, in some embodiments, layout design 100 includes at least an additional column of cells, similar to column 1, and being adjacent to column 1. For example, in some embodiments, layout design 100 includes at least an additional row of cells, similar to row 2, adjacent to row 1 along cell boundary 101a. For example, in some embodiments, layout design 100 includes at least an additional row of cells, similar to row 3, adjacent to row 4 along corresponding cell boundary 101e. In some embodiments, standard cell layout design 102a or 102b alternates with standard cell layout design 104a or 104b in the second direction Y.

Each of standard cell layout designs 102a and 102b have a height H1 in the second direction Y. Standard cell layout designs 102a and 102b are a same layout design as each other. In some embodiments, standard cell layout designs 102a and 102b are a different layout design from each other.

Each of standard cell layout designs 104a and 104b have a height H2 in the second direction Y. Height H2 is different from height H1. Standard cell layout designs 104a and 104b are a same layout design as each other. In some embodiments, standard cell layout designs 104a and 104b are a different layout design from each other.

Figure 3A:
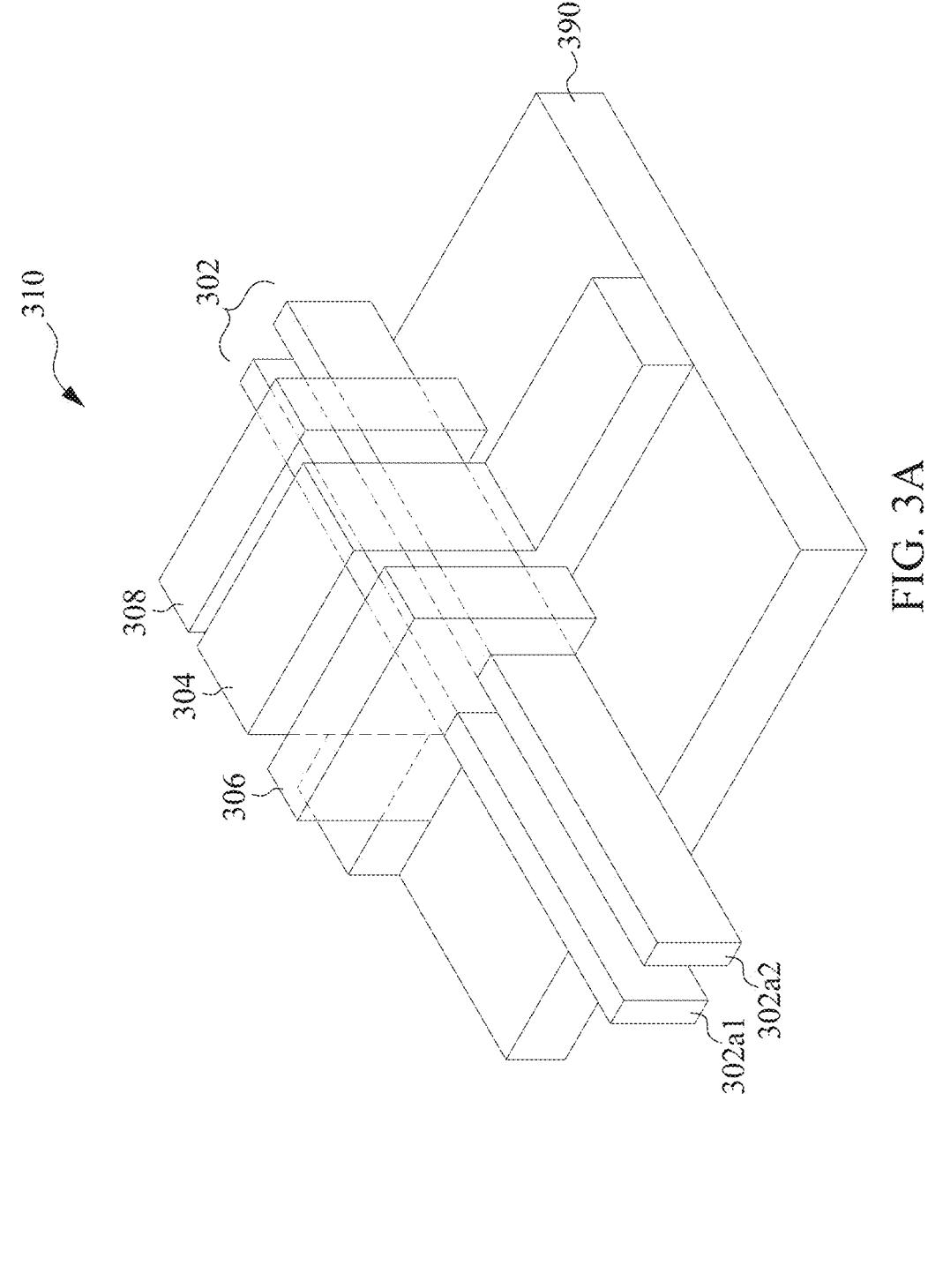
FIGS. 3A-3B are perspective views of finFETs, in accordance with some embodiments.
Figure 3B:
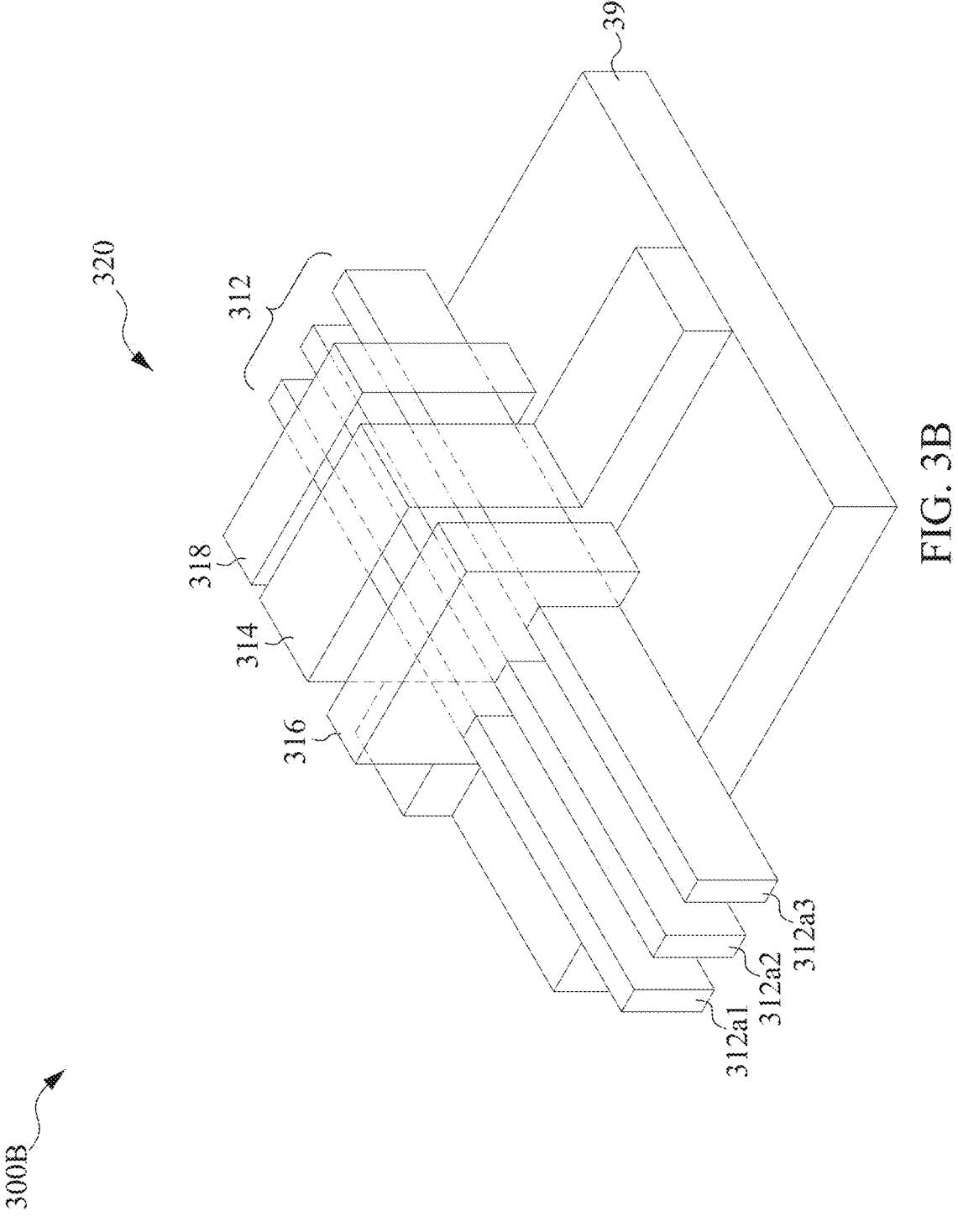
Figure 4A:
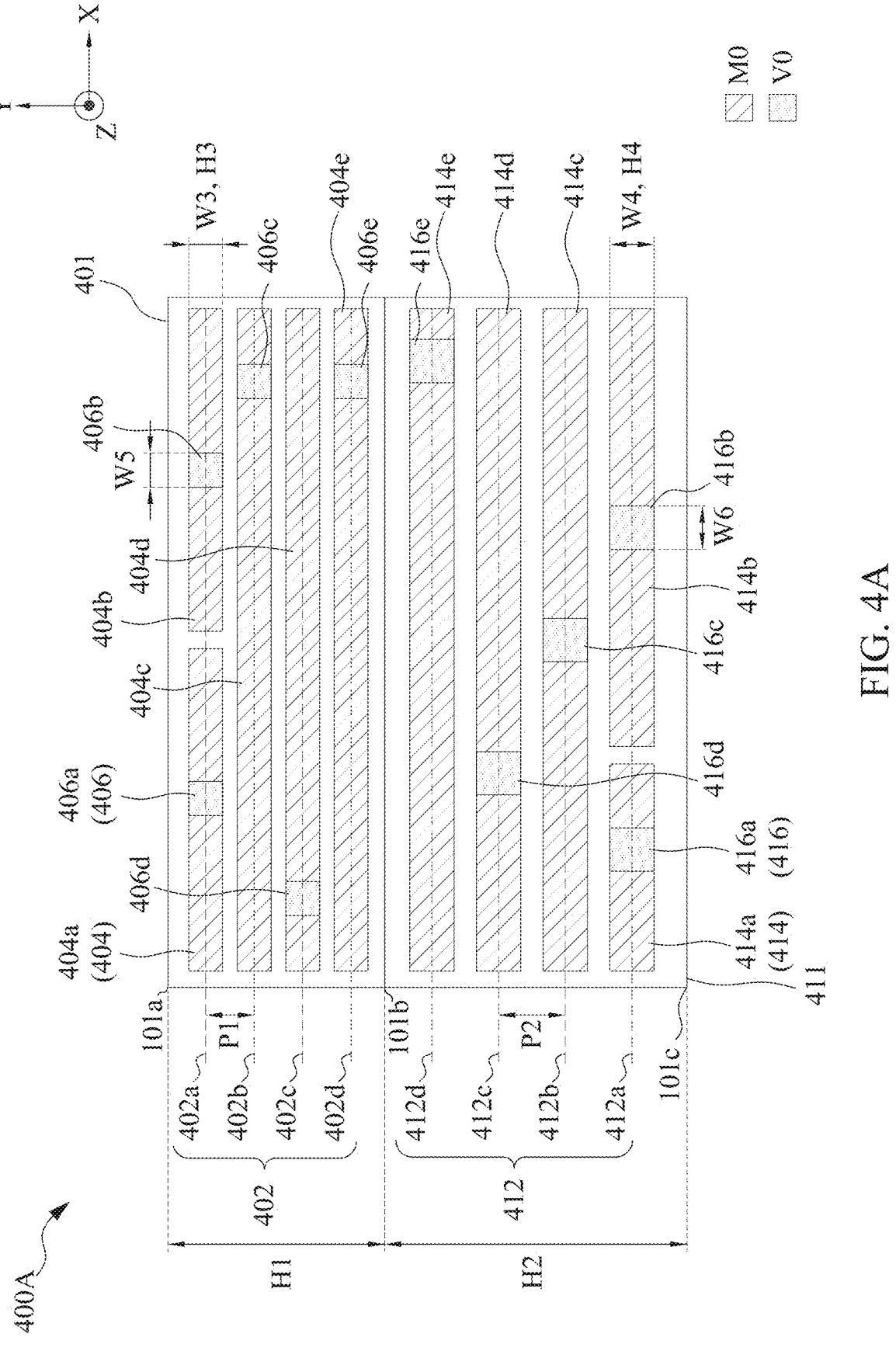
FIG. 4A is a diagram of layout design of an integrated circuit, in accordance with some embodiments.
Figure 4B:
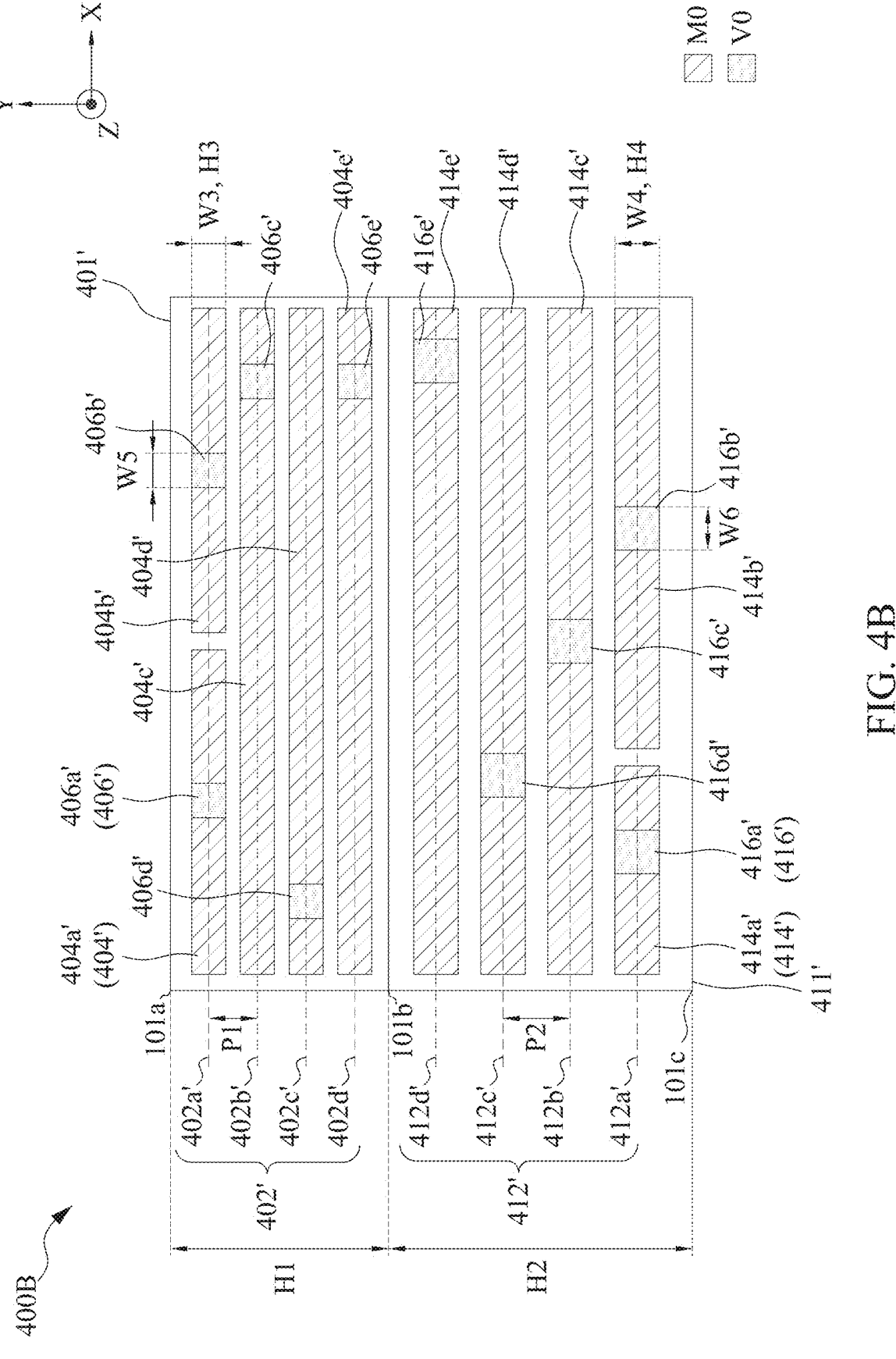
FIG. 4B is a diagram of a top view of an integrated circuit, in accordance with some embodiments.
Figure 5A:
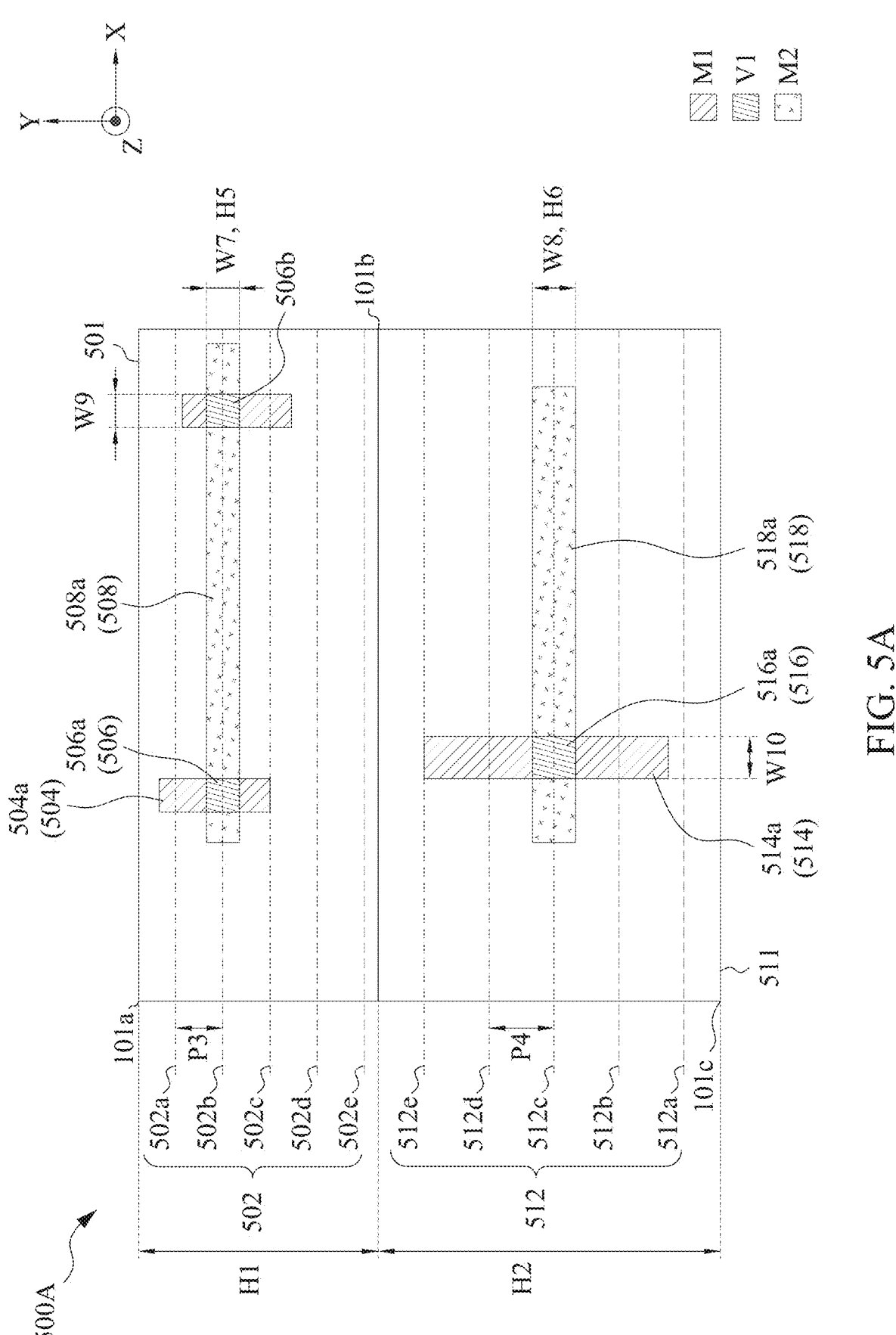
FIG. 5A is a diagram of layout design of an integrated circuit, in accordance with some embodiments.
Figure 5B:
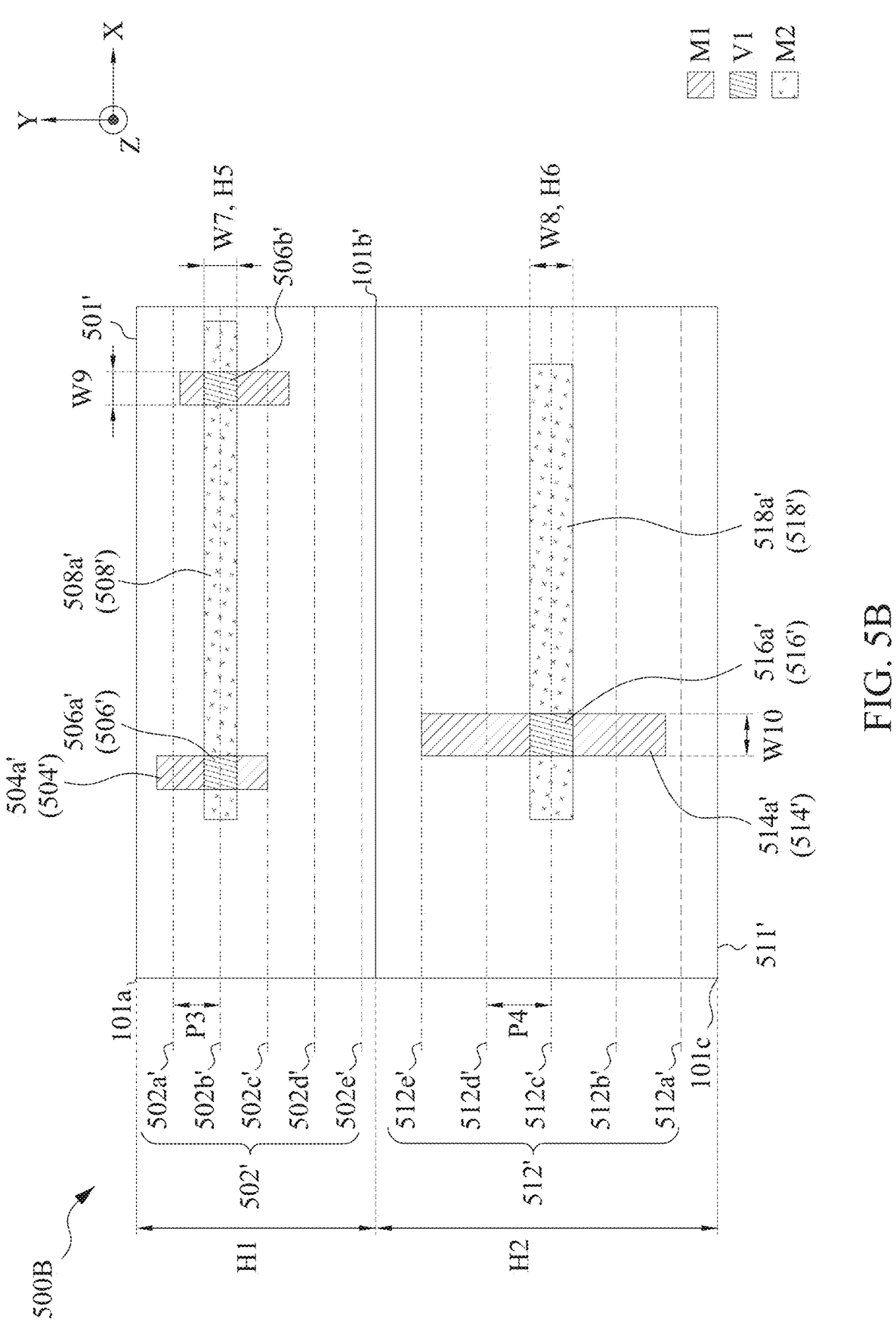
FIG. 5B is a diagram of a top view of an integrated circuit, in accordance with some embodiments.

Standard cell layout designs 102a and 102b are useable to manufacture integrated circuit 300A (FIG. 3A), standard cell 401' of FIG. 4B and standard cell of 501' FIG. 5B. Standard cell layout designs 104a and 104b are useable to manufacture integrated circuit 300B (FIG. 3B), standard cell 411' of FIG. 4B and standard cell 511' of FIG. 5B.

In some embodiments, one or more of standard cell layout designs 102a, 102b, 104a or 104b is a layout design of a logic gate cell. In some embodiments, a logic gate cell includes an AND, OR, NAND, NOR, XOR, INV, AND-OR-Invert (AOI), OR-AND-Invert (OAI), MUX, Flip-flop, BUFF, Latch, delay, or clock cells. In some embodiments, one or more of standard cell layout designs 102a, 102b, 104a or 104b is a layout design of a memory cell. In some embodiments, a memory cell includes a static random access memory (SRAM), a dynamic RAM (DRAM), a resistive RAM (RRAM), a magnetoresistive RAM (MRAM) or read only memory (ROM). In some embodiments, one or more of standard cell layout designs 102a, 102b, 104a or 1084b includes layout designs of one or more active or passive elements. Examples of active elements include, but are not limited to, transistors and diodes. Examples of transistors include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.), FinFETs, and planar MOS transistors with raised source/drain. Examples of passive elements include, but are not limited to, capacitors, inductors, fuses, and resistors.

Figure 2A:
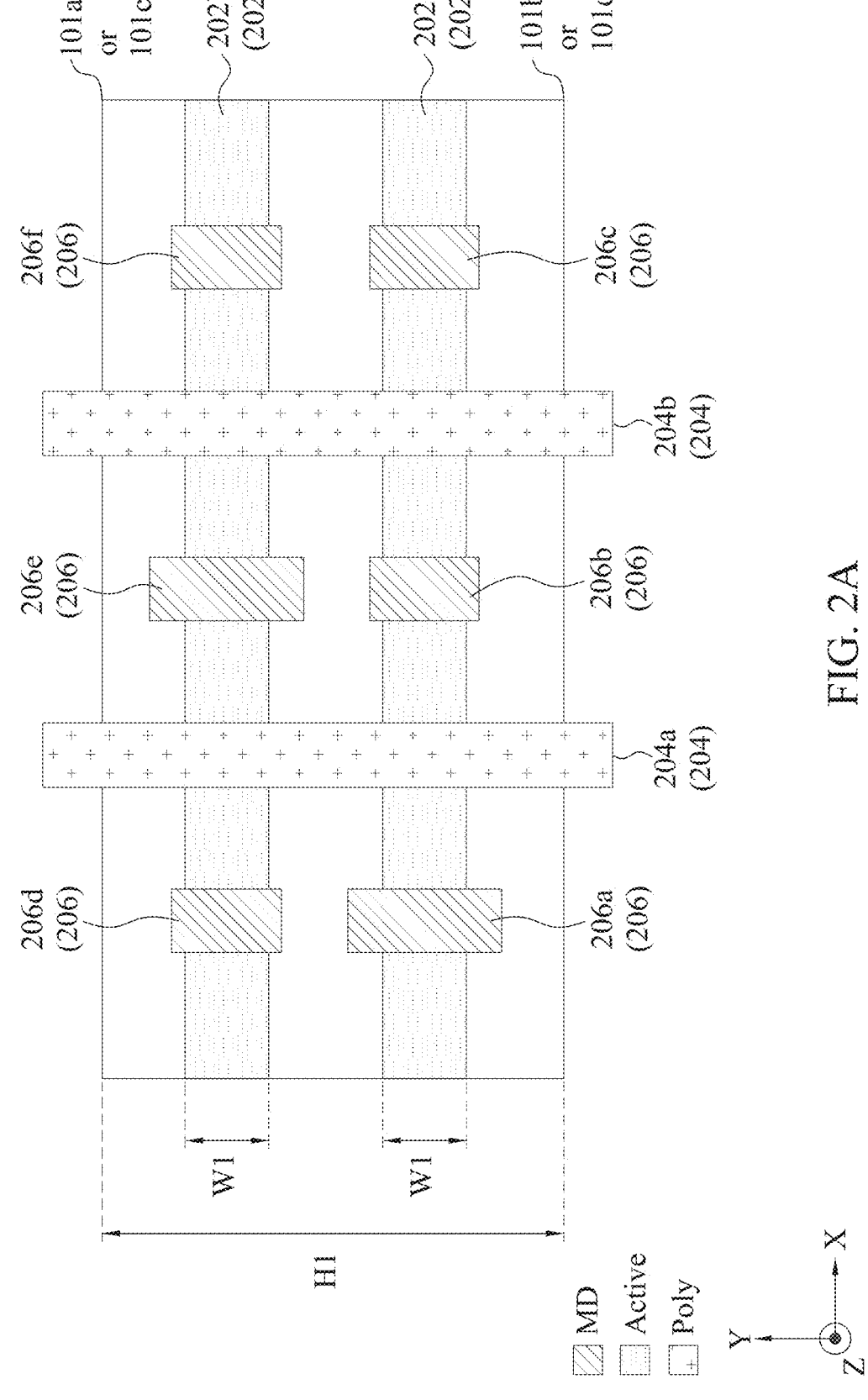
FIG. 2A is a diagram of layout design of an integrated circuit, in accordance with some embodiments.
Figure 2B:
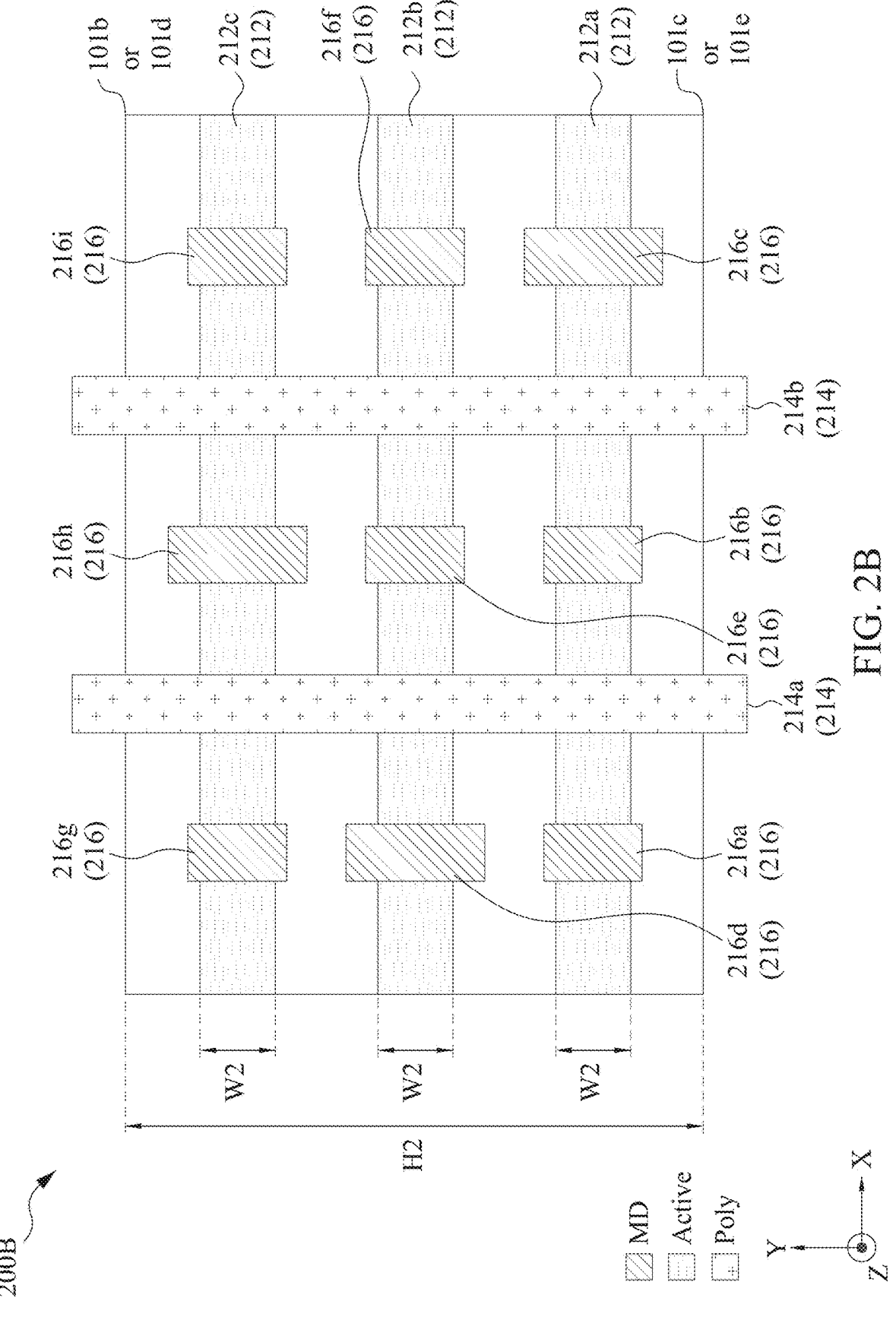
FIG. 2B is a diagram of layout design of an integrated circuit, in accordance with some embodiments.

FIGS. 2A-2B are diagrams of layout designs, in accordance with some embodiments.

FIG. 2A is a diagram of layout design 200A of an integrated circuit 200C or integrated circuit 300A, in accordance with some embodiments. FIG. 2B is a diagram of layout design 200B of an integrated circuit 200C or integrated circuit 300B, in accordance with some embodiments. In some embodiments, FIGS. 2A-2B include additional elements not shown in FIGS. 2A-2B.

Layout design 200A is an embodiment of standard cell layout design 102a or 102b of FIG. 1. At least a portion of layout design 200A is a layout diagram of standard cell 230 (FIG. 2C) or integrated circuit 300A of FIG. 3A, in accordance with some embodiments.

For case of illustration, layout designs 200A, 200B (FIG. 2B), 400A (FIG. 4A) and 500A (FIG. 5A) have been separated based on different layers of layout design 100. For example, layout designs 200A and 200B include one or more features of layout design 100 including an active region (active or OD) level, a POLY level and a metal over diffusion (MD) level of layout design 100A, layout design 400A includes one or more features of layout design 100 including a via zero (V0) level and a metal zero (M0) level of layout design 100, and layout design 500A includes one or more features of layout design 100 including a metal one (M1) level, a via one (V1) level and a metal two (M2) level of layout design 100, simplified for case of illustration. In some embodiments, one or more of layout designs 200A, 200B, 400A or 400B can be combined with another of one or more of layout designs 200A, 200B, 400A or 400B in forming at least standard cell layout design 102a, 102b, 104a or 104b.

Components that are the same or similar to those in each of FIGS. 1, 2A-2C, 3A-3B, 4A-4B, 5A-5B, and 6-9 are given the same reference numbers, and similar detailed description thereof is thus omitted.

Figure 2C:
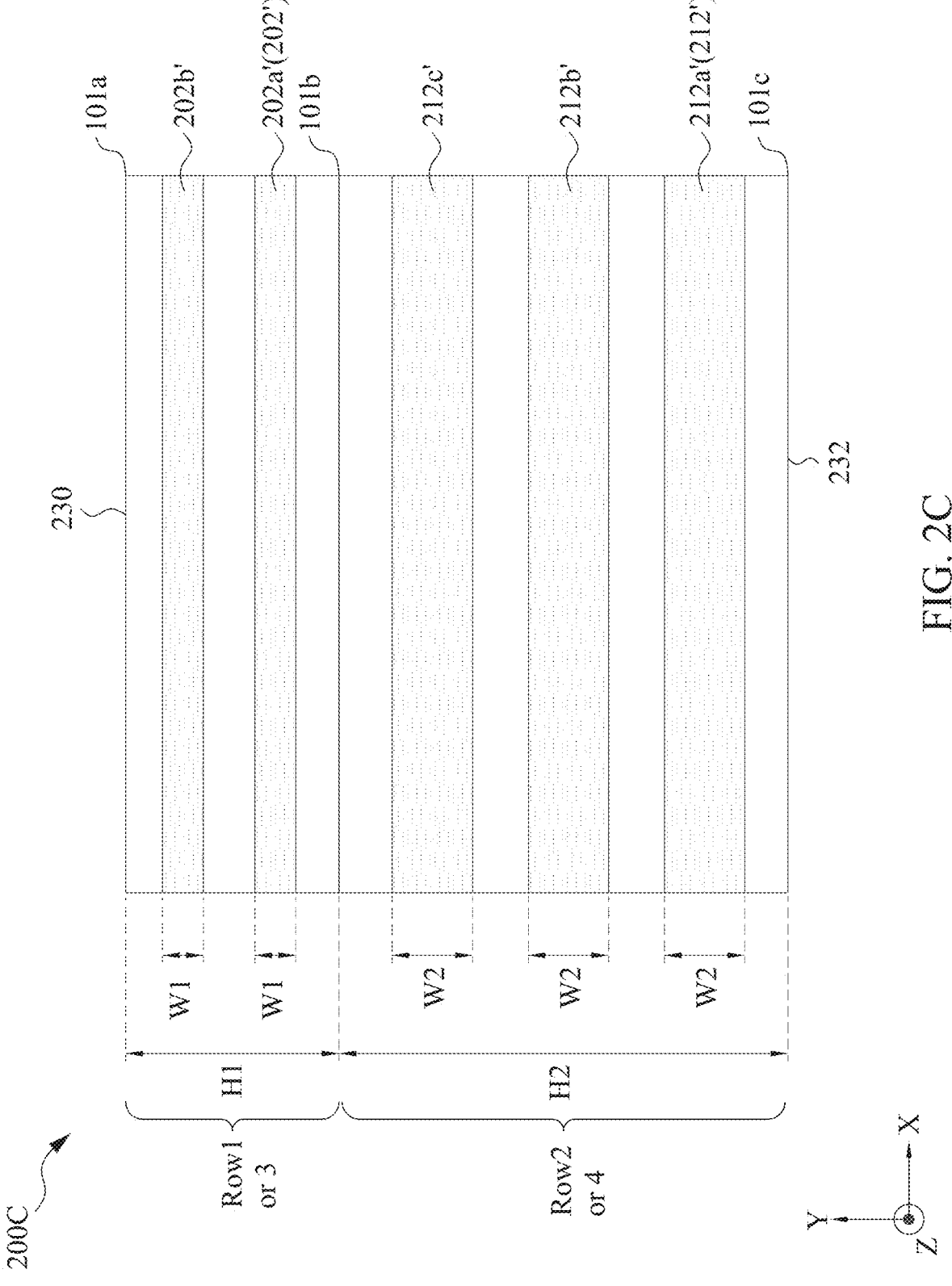
FIG. 2C is a diagram of a top view of an integrated circuit, in accordance with some embodiments.

At least a portion of layout design 200A is usable to manufacture standard cell 230 (FIG. 2C) or integrated circuit 300A of FIG. 3A, in accordance with some embodiments.

Layout design 200A has a height H1 in the second direction Y. Layout design 200A includes active region layout patterns 202a and 202b (collectively referred to as a "set of active region layout patterns 202") extending in a first direction X. Active region layout patterns 202a and 202b of the set of active region layout patterns 202 are separated from one another in the second direction Y. Active region layout pattern 202a or 202b is usable to manufacture corresponding active region 202a' or 202b (FIG. 2C). Active region layout pattern 202a or 202b is usable to manufacture active region 302 (FIG. 3A) of integrated circuit 300A. In some embodiments, the set of active region layout patterns 202 is referred to as an oxide diffusion (OD) region which defines the source or drain diffusion regions of integrated circuit 300A.

In some embodiments, active region layout pattern 202a or 202b is usable to manufacture fins 302a1 and 302a2 of active region 302 (FIG. 3A). While the set of active region layout patterns 202 and 212 of FIGS. 2A-2B, are described as being usable to manufacture fins of active regions 302 and 312 of FIGS. 3A-3B, it is understood that the fins of active region 302 or 312 can be replaced with corresponding nanosheets or nanowires. For example, in some embodiments, active region layout pattern 202a or 202b is usable to manufacture nanosheets (not shown) for active region 302 of a nanosheet transistor in row 1 or 3 of layout design 100. For example, in some embodiments, active region layout pattern 202a or 202b is usable to manufacture nanowires (not shown) for active region 302 of a nanowire transistor in row 1 or 3 of layout design 100.

Active region layout patterns 202a and 202b each have a width W1 in the second direction Y. In some embodiments, the widths W1 of active region layout patterns 202a and 202b are different from each other.

In some embodiments, at least the width W1 of active region layout patterns 202a and 202b or the number of active region layout patterns in the set of active region layout patterns 202 is directly related to the height H1 of layout design 200A. For example, at least an increase in the width W1 of active region layout patterns 202a and 202b or an increase in the number of active region layout patterns in the set of active region layout patterns 202, causes an increase in the height H1 of layout design 200A. Similarly, for example, at least a decrease in the width W1 of active region layout patterns 202a and 202b or a decrease in the number of active region layout patterns in the set of active region layout patterns 202, causes a decrease in the height H1 of layout design 200A. In some embodiments, the height H1 of layout design 200A is related to the number of conducting devices (e.g., transistors) manufactured by layout design 200A and the corresponding speed and driving strength of the conducting devices (e.g., transistors).

In some embodiments, an increase in the height H1 of layout design 200A causes the number of conducting devices (e.g., transistors) manufactured by layout design 200A to increase, and the corresponding speed and driving strength of the conducting devices (e.g., transistors) increases. In some embodiments, a decrease in the height H1 of layout design 200A causes the number of conducting devices (e.g., transistors) manufactured by layout design 200A to decrease, and the corresponding speed and driving strength of the conducting devices (e.g., transistors) decreases.

In some embodiments, active region layout pattern 202a is usable to manufacture source and drain regions of an n-type finFET transistor, an n-type nanosheet transistor or an n-type nanowire transistor, and active region layout pattern 202b is usable to manufacture source and drain regions of a p-type finFET transistor, a p-type nanosheet transistor or a p-type nanowire transistor. In some embodiments, active region layout pattern 202a is usable to manufacture source and drain regions of a p-type finFET transistor, a p-type nanosheet transistor or a p-type nanowire transistor, and active region layout pattern 202b is usable to manufacture source and drain regions of an n-type finFET transistor, an n-type nanosheet transistor or an n-type nanowire transistor.

In some embodiments, the set of active region layout patterns 202 is located on a first level. In some embodiments, the first level corresponds to an active level or an OD level of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B).

Other configurations or quantities of patterns in the set of active region layout patterns 202 are within the scope of the present disclosure.

Layout design 200A further includes at least gate layout pattern 204a or 204b (collectively referred to as a "set of gate layout patterns 204") extending in the second direction Y.

Each of the gate layout patterns of the set of gate layout patterns 204 is separated from an adjacent gate layout pattern of the set of gate layout patterns 204 in the first direction X by a contact poly pitch (CPP—not labelled).

Gate layout pattern 204a or 204b is usable to manufacture gate 304 (FIG. 3A) of integrated circuit 300A. The set of active region layout patterns 202 is below the set of gate layout patterns 204.

The set of gate layout patterns 204 are positioned on a first portion of a second level. In some embodiments, the first portion of the second level is different from the first level. In some embodiments, the first portion of the second level corresponds to a POLY layer of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B).

Other configurations, arrangements on other levels or quantities of patterns in the set of gate layout patterns 204 are within the scope of the present disclosure.

Layout design 200A further includes at least metal over diffusion layout pattern 206a, 206b, 206c, 206d, 206e or 206f (collectively referred to as a "set of metal over diffusion layout patterns 206") extending in the second direction Y.

At least one of the layout patterns of the set of metal over diffusion layout patterns 206 overlaps the set of active region layout patterns 202. Metal over diffusion layout patterns 206a, 206b and 206c overlap active region layout pattern 202a. Metal over diffusion layout patterns 206d, 206e and 206f overlap active region layout pattern 202b.

Layout patterns of the set of metal over diffusion layout patterns 206 are separated from an adjacent layout pattern of the set of metal over diffusion layout patterns 206 in at least the first direction X or the second direction Y.

The set of metal over diffusion layout patterns 206 is usable to manufacture contacts 306 and 308 (FIG. 3A) of integrated circuit 300A. In some embodiments, metal over diffusion layout patterns 206a or 206d is usable to manufacture contact 306 (FIG. 3A), and metal over diffusion layout patterns 206b or 206e is usable to manufacture contact 308 (FIG. 3A). In some embodiments, metal over diffusion layout patterns 206b or 206e is usable to manufacture contact 306 (FIG. 3A), and metal over diffusion layout patterns 206c or 206f is usable to manufacture contact 308 (FIG. 3A).

In some embodiments, the set of metal over diffusion layout patterns 206 is located on a second portion of the second level. In some embodiments, the second level is above the first level. In some embodiments, the second portion of the second level corresponds to a metal over diffusion (MD) level of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B). In some embodiments, the first portion of the second level is the same as the second portion of the second level. In some embodiments, the second level includes the MD portion and the POLY portion.

Other configurations, arrangements on other levels or quantities of patterns in the set of metal over diffusion layout patterns 206 are within the scope of the present disclosure.

FIG. 2B is a diagram of a layout design 200B of integrated circuit, in accordance with some embodiments.

Layout design 200B is an embodiment of standard cell layout design 104a or 104b of FIG. 1. At least a portion of layout design 200B is a layout diagram of standard cell 232 (FIG. 2C) or integrated circuit 300B of FIG. 3B, in accordance with some embodiments.

Layout design 200B has a height H2 in the second direction Y. At least a portion of layout design 200A is usable to manufacture standard cell 232 (FIG. 2C) or integrated circuit 300A of FIG. 3A, in accordance with some embodiments.

Layout design 200B includes active region layout patterns 212a, 212b and 212c (collectively referred to as a "set of active region layout patterns 212") extending in the first direction X. In some embodiments, the set of active region layout patterns 212 is located on the first level. Each of active region layout patterns 212a, 212b and 212c of the set of active region layout patterns 212 are separated from one another in the second direction Y.

Active region layout pattern 212a, 212b or 212c is usable to manufacture corresponding active region 212a', 212b' or 212c' (FIG. 2C). Active region layout pattern 212a, 212b or 212c is usable to manufacture active region 312 (FIG. 3B) of integrated circuit 300B. In some embodiments, the set of active region layout patterns 212 is referred to as the OD region which defines the source or drain diffusion regions of integrated circuit 300B.

In some embodiments, one of active region layout pattern 212a, 212b or 212c is usable to manufacture fins 312a1, 312a2 and 312a3 of active region 312 (FIG. 3B). In some embodiments, one of active region layout pattern 212a, 212b or 212c is usable to manufacture nanosheets (not shown) for active region 312 of a nanosheet transistor in row 2 or 4 of layout design 100. In some embodiments, active region layout pattern 212a, 212b or 212c is usable to manufacture nanowires (not shown) for active region 312 of a nanowire transistor in row 2 or 4 of layout design 100.

Active region layout patterns 212a, 212b and 212c each have a width W2 in the second direction Y. The width W2 of the set of active region layout patterns 212 is greater than the width W1 of the set of active region layout patterns 202. In some embodiments, the width W2 of at least one of active region layout pattern 212a, 212b or 212c is different from the width W2 of at least another of active region layout pattern 212a, 212b or 212c.

In some embodiments, at least the width W2 of active region layout patterns 212a, 212b and 212c or the number of active region layout patterns in the set of active region layout patterns 212 is directly related to the height H2 of layout design 200B. For example, at least an increase in the width W2 of active region layout patterns 212a, 212b and 212c or an increase in the number of active region layout patterns in the set of active region layout patterns 212, causes an increase in the height H2 of layout design 200B. Similarly, for example, at least a decrease in the width W2 of active region layout patterns 212a, 212b and 212c or a decrease in the number of active region layout patterns in the set of active region layout patterns 212, causes a decrease in the height H2 of layout design 200B.

In some embodiments, active region layout patterns 212c is not included in layout design 200B, and therefore the number of active region layout patterns in layout design 200B is the same as the number of active region layout patterns in layout design 200A. However, in these embodiments, the width W2 of active region layout patterns 212a and 212b is greater than the width W1 of active region layout patterns 202a and 202b resulting in the height H2 of layout design 200B still being greater than the height H1 of layout design 200A.

In some embodiments, the height H2 of layout design 200B is related to the number of conducting devices (e.g., transistors) manufactured by layout design 200B and the corresponding speed and driving strength of the conducting devices (e.g., transistors). In some embodiments, an increase in the height H2 of layout design 200B causes the number of conducting devices (e.g., transistors) manufactured by layout design 200B to increase, and the corresponding speed and driving strength of the conducting devices (e.g., transistors) increases. In some embodiments, a decrease in the height H2 of layout design 200B causes the number of conducting devices (e.g., transistors) manufactured by layout design 200B to decrease, and the corresponding speed and driving strength of the conducting devices (e.g., transistors) decreases.

In some embodiments, active region layout pattern 212a is usable to manufacture source and drain regions of an n-type finFET transistor, an n-type nanosheet transistor or an n-type nanowire transistor, active region layout pattern 212b is usable to manufacture source and drain regions of a p-type finFET transistor, a p-type nanosheet transistor or a p-type nanowire transistor, and active region layout pattern 212c is usable to manufacture source and drain regions of an n-type finFET transistor, an n-type nanosheet transistor or an n-type nanowire transistor.

In some embodiments, active region layout pattern 212a is usable to manufacture source and drain regions of a p-type finFET transistor, a p-type nanosheet transistor or a p-type nanowire transistor, active region layout pattern 212b is usable to manufacture source and drain regions of an n-type finFET transistor, an n-type nanosheet transistor or an n-type nanowire transistor, and active region layout pattern 212c is usable to manufacture source and drain regions of a p-type finFET transistor, a p-type nanosheet transistor or a p-type nanowire transistor.

Other configurations or quantities of patterns in the set of active region layout patterns 212 are within the scope of the present disclosure.

Layout design 200B further includes at least gate layout pattern 214a or 214b (collectively referred to as a "set of gate layout patterns 214") extending in the second direction Y. Each of the gate layout patterns of the set of gate layout patterns 214 is separated from an adjacent gate layout pattern of the set of gate layout patterns 214 in the first direction X by a contact poly pitch (CPP—not labelled).

Gate layout pattern 214a or 214b is usable to manufacture gate 314 (FIG. 3B) of integrated circuit 300B. The set of active region layout patterns 212 is below the set of gate layout patterns 214. The set of gate layout patterns 214 are positioned on the first portion of the second level.

Other configurations, arrangements on other levels or quantities of patterns in the set of gate layout patterns 214 are within the scope of the present disclosure.

Layout design 200B further includes at least metal over diffusion layout pattern 216a, 216b, 216c, 216d, 216e, 216f, 216g, 216h or 216i (collectively referred to as a "set of metal over diffusion layout patterns 216") extending in the second direction Y.

At least one of the layout patterns of the set of metal over diffusion layout patterns 216 overlaps the set of active region layout patterns 212. Metal over diffusion layout patterns 216a, 216b and 216c overlap active region layout pattern 212a. Metal over diffusion layout patterns 216d, 216e and 216f overlap active region layout pattern 212b. Metal over diffusion layout patterns 216g, 216h and 216i overlap active region layout pattern 212c. Layout patterns of the set of metal over diffusion layout patterns 216 are separated from an adjacent layout pattern of the set of metal over diffusion layout patterns 216 in at least the first direction X or the second direction Y.

The set of metal over diffusion layout patterns 216 is usable to manufacture contacts 316 and 318 (FIG. 3B) of integrated circuit 300B. In some embodiments, metal over diffusion layout pattern 216a, 216d or 216g is usable to manufacture contact 316 (FIG. 3B), and metal over diffusion layout pattern 216b, 216e or 216h is usable to manufacture contact 318 (FIG. 3B). In some embodiments, metal over diffusion layout pattern 216b, 216e or 216h is usable to manufacture contact 316 (FIG. 3B), and metal over diffusion layout pattern 216c, 216f or 216i is usable to manufacture contact 318 (FIG. 3B). In some embodiments, the set of metal over diffusion layout patterns 216 is located on the second portion of the second level.

Other configurations, arrangements on other levels or quantities of patterns in the set of metal over diffusion layout patterns 216 are within the scope of the present disclosure.

FIG. 2C is a diagram of a top view of an integrated circuit 200C, in accordance with some embodiments. For case of illustration, FIG. 2C shows one or more features of integrated circuit 200C of the active region (OD) level of integrated circuit 200C or layout design 200A-200B. In other words, in some embodiments, integrated circuit 200C does not show at least gates and contacts for case of illustration.

Integrated circuit 200C is manufactured by layout designs 200A and 200B. Structural relationships including alignment, lengths and widths, as well as configurations of at least integrated circuit 200C of FIG. 2C, 300A-300B of FIGS. 3A-3B, 400B of FIG. 4B or 500B of FIG. 5B are similar to the corresponding structural relationships and corresponding configurations of at least layout design 100 of FIG. 1, 200A-200B of FIGS. 2A-2B, 400A of FIG. 4A or 500A of FIG. 5A, and similar detailed description will not be described in FIGS. 1, 2A-2C, 3A-3B, 4A-4B and 5A-5B for brevity.

Integrated circuit 200C includes standard cells 230 and 232. Standard cell 230 is manufactured by standard cell 102a of row 1 of layout design 100 or standard cell 102b of row 3 of layout design 100. Standard cell 230 includes active regions 202a' and 202b' (collectively referred to as a "set of active regions 202'").

Standard cell 232 is manufactured by standard cell 104a of row 2 of layout design 100 or standard cell 104b of row 4 of layout design 100. Standard cell 232 includes active regions 212a', 212b' and 212c' (collectively referred to as a "set of active regions 212'").

In some embodiments, the height H1 of standard cell 230 is different from the height H2 of standard cell 232. Additionally, in some embodiments, at least active region 202a' or 202b' in standard cell 230 has a conducting property that is different from the conducting property of at least active region 212a', 212b' or 212c' in standard cell 232. In some embodiments, the conducting property of standard cell 230 or 232 is related to the corresponding number of conducting devices in corresponding standard cell 230 or 232. In some embodiments, at least active region 202a' or 202b' in standard cell 230 has a first number of conducting devices (e.g., transistors) that is different from a second number of conducting devices (e.g., transistors) in at least active region 212a', 212b' or 212c' in standard cell 232.

In some embodiments, the conducting devices include finFETs, and active regions 202a' and 202b' in standard cell 230 corresponds to fin structures (e.g., fins 302a1 and 302a2 of FIG. 3A) of finFETs (e.g., integrated circuit 300A), and active regions 212a', 212b' and 212c' in standard cell 232 corresponds to fin structures (e.g., fins 312a1, 312a2 and 312a3 of FIG. 3B) of finFETs (e.g., integrated circuit 300B).

In some embodiments, the conducting devices include nanosheet transistors, and active regions 202a' and 202b' in standard cell 230 corresponds to nanosheet structures (not shown) of nanosheet transistors, and active regions 212a', 212b' and 212c' in standard cell 232 corresponds to nanosheet structures (not shown) of nanosheet transistors.

In some embodiments, the conducting devices include nanowire transistors, and active regions 202a' and 202b' in standard cell 230 corresponds to nanowire structures (not shown) of nanowire transistors, and active regions 212a', 212b' and 212c' in standard cell 232 corresponds to nanowire structures (not shown) of nanowire transistors.

In some embodiments, the height H1 or H2 of corresponding standard cell 230 or 232 is related to the number of conducting devices (e.g., transistors) and the corresponding speed and driving strength of the conducting devices (e.g., transistors). In some embodiments, an increase in the height H1 or H2 of corresponding standard cell 230 or 232 causes the number of conducting devices (e.g., transistors) to increase, and the corresponding speed and driving strength of the conducting devices (e.g., transistors) increases. In some embodiments, a decrease in the height H1 or H2 of corresponding standard cell 230 or 232 causes the number of conducting devices (e.g., transistors) to decrease, and the corresponding speed and driving strength of the conducting devices (e.g., transistors) decreases.

In some embodiments, the difference between the first number of conducting devices in at least active region 202a' or 202b' and the second number of conducting devices in at least active region 212a', 212b' or 212c' is manifested as a difference between the number of active regions 202a' or 202b' in standard cell 230, and the number of active regions 212a', 212b' or 212c' in standard cell 232. In some embodiments, active region 212c' is not included in standard cell 232, and therefore the number of active regions in standard cell 232 is the same as the number of active regions in standard cell 230. However, in these embodiments, the width W2 of active regions 212a' and 212b' is greater than the width W1 of active regions 202a' and 202b' resulting in the height H2 of standard cell 232 still being greater than the height H1 of standard cell 230.

In some embodiments, the difference between the first number of conducting devices in at least active region 202a' or 202*b*' and the second number of conducting devices in at least active region 212*a*', 212*b*' or 212*c*' is manifested as a difference between the width W1 of active region 202*a*' or 202*b*' of standard cell 230, and the width W2 of active region 212*a*', 212*b*' or 212*c*' of standard cell 232. For example, the width W1 of active region 202*a*' or 202*b*' in standard cell 230 is different from the width W2 of active region 212*a*', 212*b*' or 212*c*' in standard cell 232. In some embodiments, the difference between the width W1 of active region 202*a*' or 202*b*' and the width W2 of active region 212*a*', 212*b*' or 212*c*' represents a difference between the first predetermined number of conducting devices in the set of active regions 202' and the second predetermined number of conducting devices in the set of active regions 212'. In some embodiments, at least active region 202*a*' or 202*b*' includes two fin structures extending in the X-direction (as shown in FIG. 3A), and at least active region 212*a*', 212*b*' or 212*c*' includes three fin structures extending in the X-direction (as shown in FIG. 3B). Other number of fins structures in the set of active regions 202' and 212' are within the scope of the present disclosure.

Other configurations, widths or quantities of active regions in the set of active regions 202' and 212' are within the scope of the present disclosure.

In some embodiments, integrated circuit 200C (and corresponding layout designs 200A and 200B) is configured to optimize the speed and performance of standard cells 230 and 232, while maintaining at least the standard cell area, routability or pin-accessibility of the hybrid standard cells. For example, in some embodiments, by having standard cells 230 and 232 with different corresponding cell heights and at least variable via dimensions, variable pin widths or variable metal pitches, standard cells 230 and 232 of the present disclosure are able to switch states fast enough in order to pass timing tests or timing violations, but also do not consume additional power by being overdesigned by having a driving current capability more than needed in order to pass the timing tests or timing violations. Thus, standard cells 230 and 232 are able to at least maintain area, routability and pin-accessibility similar to other approaches.

FIGS. 3A-3B are perspective views of finFETs 310 and 320, in accordance with some embodiments. In FIG. 3A, a finFET 310 is formed over two fin structures 302*a*1 and 302*a*2 in active region 302. The gate of finFET 310 is formed by gate 304 over fin structures 302*a*1 and 302*a*2. One of the source terminal or drain terminal of finFET 310 is formed by contact 306 over fin structures 302*a*1 and 302*a*2. The other of the source terminal or drain terminal of finFET 310 is formed by contact 308 over fin structures 302*a*1 and 302*a*2.

In FIG. 3B, a finFET 320 is formed over three fin structures 312*a*1, 312*a*2 and 312*a*3 in active region 312. The gate of finFET 320 is formed by gate 314 over fin structures 312*a*1, 312*a*2 and 312*a*3. One of the source terminal or drain terminal of finFET 320 is formed by contact 316 over fin structures 312*a*1, 312*a*2 and 312*a*3. The other of the source terminal or drain terminal of finFET 320 is formed by contact 318 over fin structures 312*a*1, 312*a*2 and 312*a*3.

In some embodiments, the number of fin structures in finFET 320 is greater than the number of fin structures in finFET 310. Other configurations or number of fin structures in active region 302 or 312 are within the scope of the present disclosure.

In some embodiments, the number of gates in finFET 320 is greater than the number of gates in finFET 310. Other configurations or number of gates for at least gate 304 or 324 are within the scope of the present disclosure.

FIG. 4A is a diagram of layout design 400A of an integrated circuit 400B, in accordance with some embodiments. In some embodiments, FIGS. 4A-4B include additional elements not shown in FIGS. 4A-4B.

Layout design 400A is usable to manufacture integrated circuit 400B of FIG. 4B. Layout design 400A is an embodiment of standard cell layout design 102*a* and 104*a* of FIG. 1 or standard cell layout design 102*b* and 104*b* of FIG. 1, and similar detailed description is omitted. However, layout design 400A includes the V0 level and the M0 level of layout design 100, simplified for case of illustration. In some embodiments, layout design 400A is combined with layout design 200A & 200B, and layout design 500A (FIG. 5A) in forming at least standard cell layout design 102*a* and 104*a* or standard cell layout design 102*b* and 104*b*.

Layout design 400A includes standard cell layout designs 401 and 411. Standard cell layout design 401 is an embodiment of standard cell layout design 102*a* or 102*b*, and standard cell layout design 411 is an embodiment of standard cell layout design 104*a* or 104*b*, and similar detailed description is omitted. Standard cell layout design 401 and 411 is usable to manufacture corresponding standard cell 401' and 411' (FIG. 4B).

In some embodiments, standard cell layout design 401 is combined with layout design 200A and standard cell layout design 501 (FIG. 5A) in forming at least standard cell layout design 102*a* or 102*b*. In some embodiments, standard cell layout design 411 is combined with layout design 200B and standard cell layout design 511 (FIG. 5A) in forming at least standard cell layout design 104*a* or 104*b*.

Layout design 400A further includes a set of gridlines 402, a set of gridlines 412, a set of conductive feature layout patterns 404, a set of conductive feature layout patterns 414, a set of via layout patterns 406 and a set of via layout patterns 416. Each of the set of gridlines 402 and the set of gridlines 412 extend in the first direction X.

In some embodiments, the set of gridlines 402, the set of conductive feature layout patterns 404, and the set of via layout patterns 406 are part of standard cell layout design 401. In some embodiments, the set of gridlines 412, the set of conductive feature layout patterns 414, and the set of via layout patterns 416 are part of standard cell layout design 411.

The set of gridlines 402 includes at least gridline 402*a*, 402*b*, 402*c* or 402*d*. Each gridline of the set of gridlines 402 is separated from an adjacent gridline of the set of gridlines 402 in the second direction Y by a pitch P1.

The set of gridlines 412 includes at least gridline 412*a*, 412*b*, 412*c* or 412*d*. Each gridline of the set of gridlines 412 is separated from an adjacent gridline of the set of gridlines 412 in the second direction Y by a pitch P2. The pitch P2 is different from the pitch P1. In some embodiments, the pitch P2 is the same as the pitch P1. The set of gridlines 402 is separated from the set of gridlines 412 in the second direction Y. In some embodiments, gridline 402*d* is separated from gridline 412*d* in the second direction Y by pitch P1 or P2. In some embodiments, at least a gridline in set of gridlines 402 or 412 is aligned with at least cell boundary 101*a*, 101*b*, 101*c*, 101*d* or 101*e* of standard cell layout design 102*a*, 102*b*, 104*a* or 104*b*.

The set of gridlines 402 or 412 defines corresponding regions where the corresponding set of conductive feature layout patterns 404 or 414 are positioned. In some embodiments, gridline 402*a* defines regions where conductive feature layout patterns 404*a* and 404*b* are positioned, and gridline 412*a* defines regions where conductive feature layout patterns 414*a* and 414*b* are positioned. In some embodiments, each gridline 402b, 402c, 402d, 412b, 412c or 412d defines regions where corresponding conductive feature layout pattern 404c, 404d, 404c, 414c, 414d or 414c is positioned.

In some embodiments, the set of gridlines 402 are referred to as a first set of routing tracks, and the set of gridlines 412 are also referred to as a second set of routing tracks. In some embodiments, the set of gridlines 402 or 412 or the first or second set of routing tracks correspond to metal 0 (M0) routing tracks.

Other configurations, pitches, distances or quantities of gridlines in the set of gridlines 402 or 412 are within the scope of the present disclosure.

At least the set of conductive feature layout patterns 404 or 414 extends in the first direction X. The set of conductive feature layout patterns 404 includes at least conductive feature layout pattern 404a, 404b, 404c, 404d or 404c. The set of conductive feature layout patterns 414 includes at least conductive feature layout pattern 414a, 414b, 414c, 414d or 414c. In some embodiments, the set of conductive feature layout patterns 404 is also referred to as a first set of pin layout patterns, and the set of conductive feature layout patterns 414 is also referred to as a second set of pin layout patterns.

At least the set of conductive feature layout patterns 404 or 414 is located on a third level. In some embodiments, the third level is above the first and second level. In some embodiments, the third level corresponds to a metal zero (M0) level of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B). In some embodiments, the third level corresponds to other metal levels or layers, and is within the scope of the present disclosure.

Conductive feature layout patterns 404a and 404b are separated from each other in the first direction X, and conductive feature layout patterns 414a and 414b are separated from each other in the first direction X. In some embodiments, other conductive feature layout patterns in the set of conductive feature layout patterns 404 or 414 are separated from each other in the first direction X. In some embodiments, at least conductive feature layout patterns 404a and 404b or conductive feature layout patterns 414a and 414b are corresponding single conductive feature layout patterns.

The set of conductive feature layout patterns 404 or 414 is usable to manufacture a corresponding set of conductive structures 404' or 414' (FIG. 4B) of an integrated circuit 400B. Conductive feature layout patterns 404a, 404b, 404c, 404d, 404c, 414a, 414b, 414c, 414d, 414c are usable to manufacture corresponding conductive structures 404a', 404b', 404c', 404d', 404e', 414a', 414b', 414c', 414d', 414e' (FIG. 4B).

The set of conductive feature layout patterns 404 or 414 overlaps corresponding layout design 200A or 200B. In some embodiments, the set of conductive feature layout patterns 404 or 414 overlaps other underlying layout patterns (not shown) of other layout levels of corresponding layout design 200A or 200B. In some embodiments, each layout pattern 404a, 404b, 404c, 404d, 404c of the set of conductive feature layout patterns 404 has a width W3 in the second direction Y. In some embodiments, each layout pattern 414a, 414b, 414c, 414d, 414c of the set of conductive feature layout patterns 414 has a width W4 in the second direction Y. In some embodiments, the width W4 of at least one of the set of conductive feature layout patterns 414 is greater than the width W3 of at least one of the set of conductive feature layout patterns 404.

In some embodiments, layout patterns 404a and 404b overlap gridline 402a, and layout patterns 414a and 414b overlap gridline 412a. In some embodiments, each layout pattern 404c, 404d, 404c of the set of conductive feature layout patterns 404 overlaps a corresponding gridline 402b, 402c, 402d of the set of gridlines 402. In some embodiments, each layout pattern 414c, 414d, 414c of the set of conductive feature layout patterns 414 overlaps a corresponding gridline 412b, 412c, 412d of the set of gridlines 412. In some embodiments, a center of layout patterns 404a and 404b are aligned in the first direction X with gridline 402a, and a center of layout patterns 414a and 414b are aligned in the first direction X with gridline 412a. In some embodiments, a center of each layout pattern 404c, 404d, 404c of the set of conductive feature layout patterns 404 is aligned in the first direction X with a corresponding gridline 402b, 402c, 402d of the set of gridlines 402. In some embodiments, a center of each layout pattern 414c, 414d, 414e of the set of conductive feature layout patterns 414 is aligned in the first direction X with a corresponding gridline 412b, 412c, 412d of the set of gridlines 412.

In some embodiments, layout patterns 404a, 404b, 404c, 404d and 404c of the set of conductive feature layout patterns 404 correspond to 4 M0 routing tracks in standard cell layout design 102a or 102b, and layout patterns 414a, 414b, 414c, 414d and 414e of the set of conductive feature layout patterns 414 correspond to 4 M0 routing tracks in standard cell layout design 104a or 104b.

Other quantities of routing tracks in the set of conductive feature layout patterns 404, 414, 508, 518 or metal layers are within the scope of the present disclosure.

Other configurations, locations or quantities of patterns in the set of conductive feature layout patterns 404, 414, 504 (FIG. 5A), 514 (FIG. 5A), 508 (FIG. 5A) or 518 (FIG. 5A) are within the scope of the present disclosure.

The set of via layout patterns 406 includes at least at least via layout pattern 406a, 406b, 406c, 406d or 406c. The set of via layout patterns 416 includes at least at least via layout pattern 416a, 416b, 416c, 416d or 416c.

The set of via layout patterns 406 or 416 is usable to manufacture a corresponding set of vias 406' or 416' (FIG. 4B). In some embodiments, via layout patterns 406a, 406b, 406c, 406d, 406c, 416a, 416b, 416c, 416d, 416e is usable to manufacture corresponding vias 406a', 406b', 406c', 406d', 406e', 416a', 416b', 416c', 416d', 416e' (FIG. 4B) of integrated circuit 400B.

In some embodiments, the set of via layout patterns 406 or 416 are between the corresponding set of conductive feature layout patterns 404 or 414 and the corresponding set of conductive feature layout patterns 504 or 514 (FIG. 5A).

At least set of via layout patterns 406 or 416 is positioned at a via over zero (V0) level of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B). In some embodiments, the V0 level corresponds to other via levels or layers, and is within the scope of the present disclosure. In some embodiments, the V0 level is between the M0 level and the M1 level. Other levels for V0 are within the scope of the present disclosure.

Via layout patterns 406a, 406b, 406c, 406d, 406c, 416a, 416b, 416c, 416d and 416c are above corresponding conductive feature layout patterns 404a, 404b, 404c, 404d, 404c, 414a, 414b, 414c, 414d and 414c.

In some embodiments, each via layout pattern 406a, 406b, 406c, 406d, 406e of the set of via layout patterns 406 has a height H3 in the second direction Y. In some embodiments, each via layout pattern 416a, 416b, 416c, 416d, 416e of the set of via layout patterns 416 has a height H4 in the second direction Y. In some embodiments, the height H4 of at least one of the set of via layout patterns 416 is greater than the height H3 of at least one of the set of via layout patterns 406.

In some embodiments, the width W3 or W4 of at least one of the corresponding set of conductive feature layout patterns 404 or 414 is different from the corresponding height H3 or H4 of at least one of the corresponding set of via layout patterns 406 or 416. In some embodiments, the width W3 or W4 of at least one of the corresponding set of conductive feature layout patterns 404 or 414 is equal to the corresponding height H3 or H4 of at least one of the corresponding set of via layout patterns 406 or 416.

In some embodiments, each via layout pattern 406a, 406b, 406c, 406d, 406e of the set of via layout patterns 406 has a width W5 in the first direction X. In some embodiments, each via layout pattern 416a, 416b, 416c, 416d, 416e of the set of via layout patterns 416 has a width W6 in the first direction X. In some embodiments, the width W6 of at least one of the set of via layout patterns 416 is greater than the width W5 of at least one of the set of via layout patterns 406.

In some embodiments, the width W5 or W6 of at least one of the corresponding set of via layout patterns 406 or 416 is different from the corresponding height H3 or H4 of at least one of the corresponding set of via layout patterns 406 or 416. In some embodiments, the width W5 or W6 of at least one of the corresponding set of via layout patterns 406 or 416 is equal to the corresponding height H3 or H4 of at least one of the corresponding set of via layout patterns 406 or 416.

In some embodiments, at least one layout pattern of the set of conductive feature layout patterns 404 or 414 or at least one via layout pattern of the set of via layout patterns 406 or 416 is not included in layout design 400A.

Other configurations, shapes, widths, heights, arrangements on other levels or quantities of patterns in the set of via layout patterns 406, 416, 506 (FIG. 5A) or 516 (FIG. 5A) are within the scope of the present disclosure.

FIG. 4B is a diagram of a top view of an integrated circuit 400B, in accordance with some embodiments.

Integrated circuit 400B is manufactured by layout design 400A. Structural relationships including positions, alignment, lengths or widths, as well as configurations of integrated circuit 400B are similar to the corresponding structural relationships and corresponding configurations of layout design 400A, and similar detailed description is omitted for brevity.

Integrated circuit 400B is an embodiment of standard cell 102a' and 104a' of FIG. 1 or standard cell 102b' and 104b' of FIG. 1, and similar detailed description is omitted. However, integrated circuit 400B includes the V0 level and the M0 level of the integrated circuit manufactured by layout design 100, simplified for case of illustration. In some embodiments, integrated circuit 400B is combined with standard cells 230 and 232, and integrated circuit 500B (FIG. 5B) in forming at least standard cell 102a' and 104a' or standard cell 102b' and 104b'.

Integrated circuit 400B includes standard cells 401' and 411'. Standard cell 401' is an embodiment of standard cell 102a' or 102b', and standard cell 411' is an embodiment of standard cell 104a' or 104b', and similar detailed description is omitted.

In some embodiments, standard cell 401' is combined with standard cell 230 and standard cell 501' (FIG. 5B) in forming at least standard cell 102a' or 102b'. In some embodiments, standard cell 411' is combined with standard cell 232 and standard cell 511' (FIG. 5B) in forming at least standard cell 104a' or 104b'.

Integrated circuit 400B further includes a set of gridlines 402', a set of gridlines 412', a set of conductive structures 404', a set of conductive structures 414', a set of vias 406' and a set of vias 416'. In some embodiments, the set of gridlines 402' and 412' are similar to corresponding set of gridlines 402 and 412, and similar detailed description is omitted. In some embodiments, the set of gridlines 402', the set of conductive structures 404', and the set of vias 406' are part of standard cell 401'. In some embodiments, the set of gridlines 412', the set of conductive structures 414', and the set of vias 416' are part of standard cell 411'.

FIG. 5A is a diagram of layout design 500A of an integrated circuit 500B, in accordance with some embodiments. In some embodiments, FIGS. 5A-5B include additional elements not shown in FIGS. 5A-5B.

Layout design 500A is usable to manufacture integrated circuit 500A of FIG. 5A.

Layout design 500A is an embodiment of standard cell layout design 102a and 104a of FIG. 1 or standard cell layout design 102b and 104b of FIG. 1, and similar detailed description is omitted. However, layout design 400A includes the M1 level, the V1 level and the M2 level of layout design 100, simplified for ease of illustration.

Layout design 500A includes standard cell layout designs 501 and 511. Standard cell layout design 501 is an embodiment of standard cell layout design 102a or 102b, and standard cell layout design 511 is an embodiment of standard cell layout design 104a or 104b, and similar detailed description is omitted. Standard cell layout design 501 and 511 is usable to manufacture corresponding standard cell 501' and 511' (FIG. 5B).

Layout design 500A further includes a set of gridlines 502, a set of gridlines 512, a set of conductive feature layout patterns 504, a set of conductive feature layout patterns 514, a set of via layout patterns 506, a set of via layout patterns 516, a set of conductive feature layout patterns 508, and a set of conductive feature layout patterns 518. Each of the set of gridlines 502 and the set of gridlines 512 extend in the first direction X.

In some embodiments, the set of gridlines 502, the set of conductive feature layout patterns 504, the set of via layout patterns 506 and the set of conductive feature layout patterns 508 are part of standard cell layout design 501. In some embodiments, the set of gridlines 512, the set of conductive feature layout patterns 514, the set of via layout patterns 516 and the set of conductive feature layout patterns 518 are part of standard cell layout design 511.

The set of gridlines 502 includes at least gridline 502a, 502b, 502c, 502d or 502c. Each gridline of the set of gridlines 502 is separated from an adjacent gridline of the set of gridlines 502 in the second direction Y by a pitch P3.

In some embodiments, each gridline of the set of gridlines 502 defines regions where a corresponding conductive feature layout pattern in the set of conductive feature layout patterns 508 is positioned. In some embodiments, gridline 502a defines regions where conductive feature layout patterns 508a is positioned.

The set of gridlines 512 includes at least gridline 512a, 512b, 512c, 512d or 512c. Each gridline of the set of gridlines 512 is separated from an adjacent gridline of the set of gridlines 512 in the second direction Y by a pitch P4. The pitch P4 is different from the pitch P3. In some embodiments, the pitch P4 is the same as the pitch P3. The set of gridlines 502 is separated from the set of gridlines 512 in the second direction Y. In some embodiments, gridline 502*d* is separated from gridline 512*d* in the second direction Y by pitch P3 or P4.

In some embodiments, at least a gridline of the set of gridlines 502 or 512 is aligned with at least a cell boundary 101*a*, 101*b*, 101*c*, 101*d* or 101*e* of standard cell layout design 102*a*, 102*b*, 104*a* or 104*b*.

In some embodiments, each gridline of the set of gridlines 512 defines regions where a corresponding conductive feature layout pattern in the set of conductive feature layout patterns 518 is positioned. In some embodiments, gridline 512*c* defines regions where conductive feature layout patterns 518*c* is positioned.

In some embodiments, the set of gridlines 502 are referred to as a third set of routing tracks, and the set of gridlines 512 are referred to as a fourth set of routing tracks. In some embodiments, the set of gridlines 502 and 512 and the third or fourth set of routing tracks correspond to metal 2 (M2) routing tracks.

Other configurations, pitches, distances or quantities of gridlines in the set of gridlines 502 or 512 are within the scope of the present disclosure.

The set of conductive feature layout patterns 504 or 514 extends in the second direction Y. The set of conductive feature layout patterns 504 includes at least conductive feature layout pattern 504*a* or 504*b*. The set of conductive feature layout patterns 514 includes at least conductive feature layout pattern 514*a*. At least the set of conductive feature layout patterns 504 or 514 is located on a fourth level. In some embodiments, the fourth level is above the first, second and third level. In some embodiments, the fourth level corresponds to a M1 level of one or more of layout designs 100, 200A, 200B, 500A or 500A (FIG. 1, 2A-2B, 4A or 5A) or integrated circuit 300A-300B, 500B or 500B (FIG. 3A-3B, 4B or 5B). In some embodiments, the fourth level corresponds to other metal levels or layers, and is within the scope of the present disclosure.

Conductive feature layout patterns 504*a* and 504*b* are separated from each other in the first direction X. For ease of illustration, the set of conductive feature layout patterns 504 includes 2 members, and the set of conductive feature layout patterns 514 includes 1 member, but other numbers of layout patterns in the set of conductive feature layout patterns 504 or 514 is within the scope of the present disclosure. In some embodiments, at least a conductive feature layout pattern in the set of conductive feature layout patterns 504 or 514 is divided into two or more portions.

The set of conductive feature layout patterns 504 or 514 is usable to manufacture a corresponding set of conductive structures 504' or 514' (FIG. 5B) of an integrated circuit 500B. Conductive feature layout patterns 504*a*, 504*b* are usable to manufacture corresponding conductive structures 504*a*', 504*b*' (FIG. 5B). Conductive feature layout pattern 514*a* is usable to manufacture corresponding conductive structure 514*a*' (FIG. 5B).

The set of conductive feature layout patterns 504 overlaps layout design 200A of FIG. 2A or standard cell layout design 401 of FIG. 4A, and the set of conductive feature layout patterns 514 overlaps layout design 200B of FIG. 2B or standard cell layout design 411 of FIG. 4B. In some embodiments, the set of conductive feature layout patterns 504 or 514 overlaps other underlying layout patterns (not shown) of other layout levels of layout design 200A-200B or 400A. In some embodiments, the set of conductive feature layout patterns 504 or 514 overlaps the corresponding set of via layout patterns 406 or 416 of FIG. 4A.

The set of conductive feature layout patterns 508 or 518 extends in the first direction X. The set of conductive feature layout patterns 508 includes at least conductive feature layout pattern 508*a*. The set of conductive feature layout patterns 518 includes at least conductive feature layout pattern 518*a*.

At least the set of conductive feature layout patterns 508 or 518 is located on a fifth level. In some embodiments, the fifth level is above the first, second, third and fourth level. In some embodiments, the fifth level corresponds to a metal two (M2) level of one or more of layout designs 100, 200A, 200B, 400A or 500A (FIG. 1, 2A-2B, 4A or 5A) or integrated circuit 300A-300B, 400B or 500B (FIG. 3A-3B, 4B or 5B). In some embodiments, the fifth level corresponds to other metal levels or layers, and is within the scope of the present disclosure.

Each of the conductive feature layout patterns in the set of conductive feature layout patterns 508 or 518 is separated from each other in the second direction Y. For case of illustration, the set of conductive feature layout patterns 508 includes 1 members, and the set of conductive feature layout patterns 518 includes 1 member, but other numbers of layout patterns in the set of conductive feature layout patterns 508 or 518 is within the scope of the present disclosure. In some embodiments, at least a conductive feature layout pattern in the set of conductive feature layout patterns 508 or 518 is divided into two or more portions.

The set of conductive feature layout patterns 508 or 518 is usable to manufacture a corresponding set of conductive structures 508' or 518' (FIG. 5B) of an integrated circuit 500B. Conductive feature layout pattern 508*a* is usable to manufacture corresponding conductive structure 508*a*' (FIG. 5B). Conductive feature layout pattern 518*a* is usable to manufacture corresponding conductive structure 1 518*a*' (FIG. 5B).

The set of conductive feature layout patterns 508 or 518 overlaps corresponding layout design 200A or 200B and layout design 400A. In some embodiments, the set of conductive feature layout patterns 508 or 518 overlaps other underlying layout patterns (not shown) of other layout levels of layout design 200A-200B and layout design 400A. In some embodiments, each layout pattern 508*a* of the set of conductive feature layout patterns 508 has a width W7 in the second direction Y. In some embodiments, each layout pattern 518*a* of the set of conductive feature layout patterns 518 has a width W8 in the second direction Y. In some embodiments, the width W8 of at least one of the set of conductive feature layout patterns 518 is greater than the width W7 of at least one of the set of conductive feature layout patterns 508.

In some embodiments, each layout pattern of the set of conductive feature layout patterns 508 overlaps a corresponding gridline of the set of gridlines 502. In some embodiments, layout pattern 508*a* overlaps gridline 502*b*. In some embodiments, a center of each layout pattern of the set of conductive feature layout patterns 508 is aligned in the first direction X with a corresponding gridline of the set of gridlines 502. In some embodiments, a center of layout pattern 508*a* is aligned in the first direction X with gridline 502*b*.

In some embodiments, each layout pattern of the set of conductive feature layout patterns 518 overlaps a corresponding gridline of the set of gridlines 512. In some embodiments, layout pattern 518*a* overlaps gridline 512*c*. In some embodiments, a center of each layout pattern of the set of conductive feature layout patterns 518 is aligned in the first direction X with a corresponding gridline of the set of gridlines 512. In some embodiments, a center of layout pattern 518a is aligned in the first direction X with gridline 512c.

In some embodiments, the set of conductive feature layout patterns 508 corresponds to 5 M2 routing tracks in standard cell layout design 102a or 102b, and the set of conductive feature layout patterns 518 corresponds to 5 M2 routing tracks in standard cell layout design 104a or 104b.

Other quantities of routing tracks in at least the set of conductive feature layout patterns 508 or 518 or different metal layers are within the scope of the present disclosure. Other configurations, locations or quantities of patterns in at least the set of conductive feature layout patterns 508 or 518 are within the scope of the present disclosure.

The set of via layout patterns 506 includes at least via layout pattern 506a or 506b. The set of via layout patterns 516 includes via layout pattern 516a. In some embodiments, at least one via layout pattern of the set of via layout patterns 506 or 516 is not included.

The set of via layout patterns 506 or 516 is usable to manufacture a corresponding set of vias 506' or 516' (FIG. 5B). In some embodiments, via layout patterns 506a, 506b of the set of via layout patterns 506 is usable to manufacture corresponding vias 506a', 506b' of the set of vias 506' (FIG. 5B) of integrated circuit 500B. In some embodiments, via layout patterns 516a of the set of via layout patterns 516 is usable to manufacture corresponding via 516a' of the set of vias 516' (FIG. 5B) of integrated circuit 500B.

In some embodiments, the set of via layout patterns 506 or 516 is between the corresponding set of conductive feature layout patterns 504 or 514 and the corresponding set of conductive feature layout patterns 508 or 518.

At least the set of via layout patterns 506 or 516 is positioned at a via over one (V1) level of one or more of layout designs 100, 200A, 200B, 500A or 500A (FIG. 1, 2A-2B, 4A or 5A) or integrated circuit 300A-300B, 500B or 500B (FIG. 3A-3B, 4B or 5B). In some embodiments, the V1 level corresponds to other via levels or layers, and is within the scope of the present disclosure. In some embodiments, the V1 level is between the M1 level and the M2 level. Other levels for V1 are within the scope of the present disclosure.

Via layout patterns 506a, 506b are above corresponding conductive feature layout patterns 504a and 504b. Via layout pattern 516a is above conductive feature layout pattern 514a.

In some embodiments, each via layout pattern 506a, 506b of the set of via layout patterns 506 has a height H5 in the second direction Y. In some embodiments, each via layout pattern 516a of the set of via layout patterns 516 has a height H6 in the second direction Y. In some embodiments, the height H6 of at least one of the set of via layout patterns 516 is greater than the height H5 of at least one of the set of via layout patterns 506.

In some embodiments, the width W7 or W8 of at least one of the corresponding set of conductive feature layout patterns 508 or 518 is different from the corresponding height H5 or H6 of at least one of the corresponding set of via layout patterns 506 or 516. In some embodiments, the width W7 or W8 of at least one of the corresponding set of conductive feature layout patterns 508 or 518 is equal to the corresponding height H5 or H6 of at least one of the corresponding set of via layout patterns 506 or 516.

In some embodiments, each via layout pattern 506a, 506b of the set of via layout patterns 506 has a width W9 in the first direction X. In some embodiments, each via layout pattern 516a of the set of via layout patterns 516 has a width W10 in the first direction X. In some embodiments, the width W10 of at least one of the set of via layout patterns 516 is greater than the width W9 of at least one of the set of via layout patterns 506.

In some embodiments, the width W9 or W10 of at least one of the corresponding set of via layout patterns 506 or 516 is different from the corresponding height H5 or H6 of at least one of the corresponding set of via layout patterns 506 or 516. In some embodiments, the width W9 or W10 of at least one of the corresponding set of via layout patterns 506 or 516 is equal to the corresponding height H5 or H6 of at least one of the corresponding set of via layout patterns 506 or 516.

FIG. 5B is a diagram of a top view of an integrated circuit 500B, in accordance with some embodiments.

Integrated circuit 500B is manufactured by layout design 500A. Structural relationships including positions, alignment, lengths or widths, as well as configurations of integrated circuit 500B are similar to the corresponding structural relationships and corresponding configurations of layout design 500A, and similar detailed description is omitted for brevity.

Integrated circuit 500B is an embodiment of standard cell 102a' and 104a' of FIG. 1 or standard cell 102b' and 104b' of FIG. 1, and similar detailed description is omitted. For example, in some embodiments, integrated circuit 500B is an embodiment of standard cell 102a' and 104a' of FIG. 1, or standard cell 102b' and 104b' of FIG. 1. However, integrated circuit 500B includes the M1 level, the V1 level and the M2 level of the integrated circuit manufactured by layout design 100, simplified for case of illustration.

Integrated circuit 500B includes standard cells 501' and 511'. Standard cell 501' is an embodiment of standard cell 102a' or 102b', and standard cell 511' is an embodiment of standard cell 104a' or 104b', and similar detailed description is omitted.

Integrated circuit 500B further includes a set of gridlines 502', a set of gridlines 512', a set of conductive structures 504', a set of conductive structures 514', a set of vias 506', a set of vias 516', a set of conductive structures 508' and a set of conductive structures 518'. In some embodiments, the set of gridlines 402' and 412' are similar to corresponding set of gridlines 402 and 412, and similar detailed description is omitted. In some embodiments, the set of gridlines 502', the set of conductive structures 504', the set of vias 506' and the set of conductive structures 508' are part of standard cell 501'. In some embodiments, the set of gridlines 512', the set of conductive structures 514', the set of vias 516' and the set of conductive structures 518' are part of standard cell 511'.

In some embodiments, at least one structure of the set of conductive structures 404', 414', 504', 514' 508' or 518' includes one or more layers of metal materials, such as Al, Cu, W, Ti, Ta, TiN, TaN, NiSi, CoSi, other suitable conductive materials, or combinations thereof. In some embodiments, at least one via of the set of vias 406', 416', 506' or 516' includes one or more layers of metal materials, such as Al, Cu, W, Ti, Ta, TiN, TaN, NiSi, CoSi, other suitable conductive materials, or combinations thereof.

Other configurations, arrangements, number of layers or materials of the set of conductive structures 404', 414', 504', 514' 508' or 518' or the set of vias 406', 416', 506' or 516' are within the contemplated scope of the present disclosure.

In some embodiments, at least integrated circuit 400B or 500B (and corresponding layout design 400A or 500A) is configured to optimize the speed and performance of standard cells 401' and 411' (or 501' and 511'), while maintaining at least the standard cell area, routability or pin-accessibility of the hybrid standard cells. For example, in some embodiments, by having standard cells 401' and 411' (or 501' and 511') with different corresponding cell heights and at least variable via dimensions, variable pin widths or variable metal pitches, standard cells 401' and 411' (or 501' and 511') of the present disclosure are able to switch states fast enough in order to pass timing tests or timing violations, but also do not consume additional power by being overdesigned by having a driving current capability more than needed in order to pass the timing tests or timing violations. Thus, standard cells 401' and 411' (or 501' and 511') are able to at least maintain area, routability and pin-accessibility similar to other approaches.

FIG. 6 is a functional flow chart of at least a portion of an IC design and manufacturing flow 600, in accordance with some embodiments. The design and manufacturing flow 600 utilizes one or more electronic design automation (EDA) tools for generating, optimizing and/or verifying a design of an IC before manufacturing the IC in operation 650. The EDA tools, in some embodiments, are one or more sets of executable instructions for execution by a processor or controller or a programmed computer to perform the indicated functionality. In at least one embodiment, the IC design and manufacturing flow 600 is performed by a design house of an IC manufacturing system discussed herein with respect to FIG. 6.

At operation 602, a design of an IC is provided by a circuit designer. In some embodiments, the design of the IC comprises an IC schematic, i.e., an electrical diagram, of the IC. In some embodiments, the schematic is generated or provided in the form of a schematic netlist, such as a Simulation Program with Integrated Circuit Emphasis (SPICE) netlist. Other data formats for describing the design are usable in some embodiments. In some embodiments, a pre-layout simulation is performed on the design to determine whether the design meets a predetermined specification. When the design does not meet the predetermined specification, the IC is redesigned. In at least one embodiment, a pre-layout simulation is omitted from FIG. 6. In at least one embodiment, method 600 further includes a pre-layout simulation performed after operation 610.

At operation 604, predesigned standard cells for the circuit design are retrieved from one or more cell libraries. In some embodiments, the cell libraries include information related to the height of the standard cells. In some embodiments, the cell library includes tall standard cells with wider pin widths, and short standard cells with narrower pin widths. In some embodiments, a tall standard cell corresponds to a standard cell having height H2 and a corresponding wider pin width (e.g., width W4 and W8) as shown in FIGS. 1, 2A-2C, 4A-4B and 5A-5B. In some embodiments, a short standard cell corresponds to a standard cell having height H1 and a corresponding narrower pin width (e.g., width W3 and W7) as shown in FIGS. 1, 2A-2C, 4A-4B and 5A-5B.

At operation 606, technology files for the circuit design are retrieved from one or more technology files. In some embodiments, the technology files include information regarding various types of cell rows for accommodating the predesigned standard cells, such as the row heights of the various types of cell rows. In some embodiments, the technology file includes design rules on variable pitch (e.g., pitches P1, P2, P3 and P4), variable metal width (e.g. widths W1, W2, W3, W4, W7 and W8), and variable via (e.g., widths W5, W6, W9 and W10 & heights H1, H2, H3, H4, H5 and H6).

At operation 610, a floor plan is created for the circuit design, to place the predesigned standard cells into the layout design, according to the netlist files and the technology files. In some embodiments, the floor plan includes specifying the positions of at least two types of standard cells (e.g., one of cell 102a or and one of cell 104a or 104b). In some embodiments, the two types of cells are placed in the floor plan sequentially in a forward order or a reverse order. For example, in some embodiments, in a forward order, the position of standard cells 102a, 104a, 102b, and 104b are specified in the corresponding order (102a, 104a, 102b and 104b) in the second direction Y. For example, in some embodiments, in a reverse order, the position of standard cells 104b, 102b, 104a and 102a are specified in the corresponding order (104b, 102b, 104a and 102a).

At operation 620, the predesigned cells for the circuit design are placed into the floor plan by the APR tool by performing cell placement. The APR tool accesses various cells from one or more cell libraries 604, and places the cells in an abutting manner to generate an IC layout diagram corresponding to the IC schematic.

The predesigned cells with the different cell heights are selected to optimize at least the performance, standard cell area, routability, pin-accessibility or power consumption of the circuit design. In some embodiments, tall cells are selected to optimize the performance and speed of the standard cells. In some embodiments, short cells are selected to optimize standard cell area, routability, pin-accessibility or power consumption of the standard cells.

Operation 620 further includes, performing design rule checks on the placed predesigned cells in the floor plan, and predesigned cells that contribute to one or more design rule violations are identified. In some embodiments, to mitigate design rule violations, different cell heights and at least variable via dimensions, variable pin widths or variable metal pitches are selected to overcome potential design rule violations.

In some embodiments, by using the hybrid standard cell approach where predesigned cells with the different cell heights and at least variable via dimensions, variable pin widths or variable metal pitches, a balance is reached in the layout design and corresponding integrated circuit such that the speed and performance of the standard cells is improved compared to other approaches, but the standard cell area, routability and pin-accessibility of the hybrid standard cells is at least similar to other approaches.

At operation 630, the APR tool performs clock tree synthesis (CTS) to minimize skew and/or insertion delays potentially present due to the placement of circuit elements in the IC layout diagram. CTS includes an optimization process to ensure that signals are transmitted and/or arrived at appropriate timings. For example, in some embodiments, during the optimization process within CTS, the timing of shorter cells with smaller metal width and/or smaller vias, and the timing of taller cells with wider metal width and/or larger vias is analyzed, and if appropriate, is adjusted.

In some embodiments, one or more cells is changed from a tall cell to a short cell (and vice versa) to add and/or remove slack (timing for signal arrival) to achieve a desired timing. In some embodiments, one or more buffers are inserted into the IC layout diagram to add and/or remove slack (timing for signal arrival) to achieve a desired timing.

In some embodiments, operation 630 includes performing a timing analysis of one or more critical paths that include the standard cells with different heights to determine timing violations in the one or more critical paths. The described CTS of operation 630 is an example. Other arrangements or operations are within the scope of various embodiments. For example, in one or more embodiments, one or more of the described operations are repeated or omitted.

At operation 640, the APR tool performs routing to route various nets interconnecting the placed circuit elements. The routing is performed to ensure that the routed interconnections or nets satisfy a set of constraints. For example, routing operation 640 includes global routing, track assignment and detailed routing. During the global routing, routing resources used for interconnections or nets are allocated. For example, the routing area is divided into a number of sub-areas, pins of the placed circuit elements are mapped to the sub-areas, and nets are constructed as sets of sub-areas in which interconnections are physically routable. During the track assignment, the APR tool assigns interconnections or nets to corresponding conductive layers of the IC layout diagram. During the detailed routing, the APR tool routes interconnections or nets in the assigned conductive layers and within the global routing resources. For example, detailed, physical interconnections are generated within the corresponding sets of sub-areas defined at the global routing and in the conductive layers defined at the track assignment. In some embodiments, the APR tool places larger vias on wider pins of taller cells, and places smaller vias on narrower pins of shorter cells. In some embodiments, the APR tool routes wider metal lines and larger vias on metal tracks above the taller cells, and routes narrower metal lines and smaller vias on metal tracks above the shorter cells.

After operation 640, the APR tool outputs the IC layout diagram. The described APR tool is an example. Other arrangements are within the scope of various embodiments. For example, in one or more embodiments, one or more of the described operations are omitted.

In operation 650, the integrated circuit is manufactured based on the IC layout diagram. In some embodiments, the layout diagram of method 600 includes one or more layout patterns of layout design 100 (FIG. 1), 200A-200B (FIGS. 2A-2B), 400A (FIG. 4A) or 500A (FIG. 5A) of an integrated circuit, such as integrated circuit 200C (FIG. 2C), 300A-300B (FIGS. 3A-3B), 400B (FIG. 4B) or 500B (FIG. 5B). In some embodiments, the integrated circuit manufactured by operation 650 includes at least integrated circuit 200C (FIG. 2C), 300A-300B (FIGS. 3A-3B), 400B (FIG. 4B) or 500B (FIG. 5B). In some embodiments, operation 650 of method 600 comprises manufacturing at least one mask based on the layout diagram, and manufacturing the integrated circuit based on the at least one mask. In some embodiments, operation 650 is performed by IC manufacturing system 800 (FIG. 8). In some embodiments, one or more of the above-described operations are omitted.

As described herein, in some embodiments, method 600 is performed to optimize the speed and performance of the standard cells, while maintaining the standard cell area, routability and pin-accessibility of the hybrid standard cells. In some embodiments, by having different cell heights and at least variable via dimensions, variable pin widths or variable metal pitches, the standard cells of the present disclosure are able to switch states fast enough in order to pass timing tests or timing violations, but also do not consume additional power by being overdesigned by having a driving current capability more than needed in order to pass the timing tests or timing violations, and the standard cells of the present disclosure are able to maintain area, routability and pin-accessibility similar to other approaches.

FIG. 7 is a flowchart of a method 700 of generating a layout design of an integrated circuit, in accordance with some embodiments. It is understood that additional operations may be performed before, during, and/or after the method 700 depicted in FIG. 7, and that some other processes may only be briefly described herein. In some embodiments, method 700 is an embodiment of one or more operations of method 600. In some embodiments, the method 700 is usable to generate one or more layout patterns of layout design 100 (FIG. 1), 200A-200B (FIGS. 2A-2B), 400A (FIG. 4A) or 500A (FIG. 5A) of an integrated circuit, such as integrated circuit 200C (FIG. 2C), 300A-300B (FIGS. 3A-3B), 400B (FIG. 4B) or 500B (FIG. 5B).

In operation 702 of method 700, a set of active region layout patterns is generated or placed on layout design 100 or 200A-200B. In some embodiments, the set of active region layout patterns of method 700 includes at least portions of one or more layout patterns of at least the set of active region layout patterns 202 or 212. In some embodiments, operation 702 includes generating or placing a first set of active region layout patterns (e.g., 202) corresponding to fabricating a first set of active regions (e.g., 202') of the integrated circuit, and generating or placing a second set of active region layout patterns (e.g., 212) corresponding to fabricating a second set of active regions (e.g., 212') of the integrated circuit.

In operation 704 of method 700, a set of gate layout patterns 204 or 214 is generated or placed on layout design 100 or 200A-200B. In some embodiments, the set of gate layout patterns of method 700 correspond to fabricating a set of gates (e.g., 304 or 314).

In operation 706 of method 700, a set of contact layout patterns is generated or placed on layout design 100 or 200A-200B. In some embodiments, the set of contact layout patterns of method 700 includes at least portions of one or more layout patterns of at least set of metal over diffusion layout patterns 206 or 216. In some embodiments, the set of contact layout patterns of method 700 correspond to fabricating a set of contacts (e.g., 306, 308, 316 or 318).

In operation 708 of method 700, a first set of gridlines is generated or placed on layout design 100, 400A or 500A. In some embodiments, the first set of gridlines of method 700 includes at least portions of the set of gridlines 402 or 412.

In operation 710 of method 700, a first set of conductive feature layout patterns is generated or placed on layout design 100, 400A or 500A. In some embodiments, the first set of conductive feature layout patterns of method 700 is also referred to as a first set of pin layout patterns and a second set of pin layout patterns. In some embodiments, the first set of conductive feature layout patterns of method 700 includes at least portions of one or more layout patterns of at least set of conductive feature layout patterns 404 or 414. In some embodiments, the first set of conductive feature layout patterns of method 700 correspond to fabricating a first set of conductive structures (e.g., 404' or 414').

In operation 712 of method 700, a first set of via layout patterns is generated or placed on layout design 100, 400A or 500A. In some embodiments, the first set of via layout patterns of method 700 includes at least portions of one or more via layout patterns of at least the set of via layout patterns 406 or 416. In some embodiments, the first set of via layout patterns correspond to fabricating a first set of vias (e.g., 406' or 416').

In operation 714 of method 700, a second set of gridlines is generated or placed on layout design 100, 400A or 500A.

In some embodiments, the second set of gridlines of method 700 includes at least portions of the set of gridlines 502 or 512.

In operation 716 of method 700, a second set of conductive feature layout patterns is generated or placed on layout design 100 or 500A. In some embodiments, the second set of conductive feature layout patterns of method 700 includes at least portions of one or more layout patterns of at least set of conductive feature layout patterns 504 or 514. In some embodiments, the second set of conductive feature layout patterns of method 700 correspond to fabricating a second set of conductive structures (e.g., 504' or 514').

In operation 718 of method 700, a second set of via layout patterns is generated or placed on layout design 100 or 500A. In some embodiments, the second set of via layout patterns of method 700 includes at least portions of one or more via layout patterns of at least the set of via layout patterns 506 or 516. In some embodiments, the second set of via layout patterns correspond to fabricating a second set of vias (e.g., 506' or 516').

In operation 720 of method 700, a third set of conductive feature layout patterns is generated or placed on layout design 100 or 500A. In some embodiments, the third set of conductive feature layout patterns of method 700 includes at least portions of one or more layout patterns of at least set of conductive feature layout patterns 508 or 518. In some embodiments, the third set of conductive feature layout patterns of method 700 correspond to fabricating a third set of conductive structures (e.g., 508' or 518').

In some embodiments, one or more of the operations of method 700 is performed to generate or place a first standard cell layout design on layout design 100, 200A-200B, 400A or 500A, and then one or more of the operations of method 700 is repeated to generate or place a second standard cell layout design on layout design 100, 200A-200B, 400A or 500A. In some embodiments, the first standard cell layout design of method 700 includes at least standard cell layout design 102a or 102b, layout design 200A, standard cell layout design 401 or standard cell layout design 501. In some embodiments, the second standard cell layout design of method 700 includes at least standard cell layout design 104a or 104b, layout design 200B, standard cell layout design 411 or standard cell layout design 511.

In some embodiments, at least one or more operations of method 600 or method 700 is performed by an EDA tool, such as system 800 of FIG. 8. In some embodiments, at least one method(s), such as method 600 or 700 discussed above, is performed in whole or in part by at least one EDA system, including system 800. In some embodiments, an EDA system is usable as part of a design house of an IC manufacturing system 900 of FIG. 9.

In some embodiments, one or more of the operations of method 700 (e.g., 702-720) is not performed. One or more of the operations of methods 600-700 is performed by a processing device configured to execute instructions for manufacturing an integrated circuit, such as integrated circuit 200C (FIG. 2C), 300A-300B (FIGS. 3A-3B), 400B (FIG. 4B) or 500B (FIG. 5B). In some embodiments, one or more operations of methods 600-700 is performed using a same processing device as that used in a different one or more operations of methods 600-700. In some embodiments, a different processing device is used to perform one or more operations of methods 600-700 from that used to perform a different one or more operations of methods 600-700.

FIG. 8 is a schematic view of a system 800 for designing an IC layout design and manufacturing an IC in accordance with some embodiments. In some embodiments, system 800 is at least a part of an EDA system. In some embodiments, system 800 includes an automated placement and routing (APR) system. In some embodiments, system 800 generates or places one or more IC layout designs described herein. In some embodiments, the IC layout designs of FIG. 8 includes at least layout design 100 of FIG. 1, layout design 200A-200B of corresponding FIGS. 2A-2B, layout design 400A of FIG. 4A or layout design 500A of FIG. 5A. In some embodiments, system 800 manufactures one or more ICs as described in FIG. 9.

System 800 includes a hardware processor 802 and a non-transitory, computer readable storage medium 804 encoded with, i.e., storing, the computer program code 806, i.e., a set of executable instructions. Computer readable storage medium 804 is configured for interfacing with manufacturing machines for producing the integrated circuit. The processor 802 is electrically coupled to the computer readable storage medium 804 via a bus 808. The processor 802 is also electrically coupled to an I/O interface 810 by bus 808. A network interface 812 is also electrically connected to the processor 802 via bus 808. Network interface 812 is connected to a network 814, so that processor 802 and computer readable storage medium 804 are capable of connecting to external elements via network 814. The processor 802 is configured to execute the computer program code 806 encoded in the computer readable storage medium 804 in order to cause system 800 to be usable for performing a portion or all of the operations as described in method 600 or 700.

In some embodiments, the processor 802 is a central processing unit (CPU), a multi-processor, a distributed processing system, an application specific integrated circuit (ASIC), and/or a suitable processing unit.

In some embodiments, the computer readable storage medium 804 is an electronic, magnetic, optical, electromagnetic, infrared, and/or a semiconductor system (or apparatus or device). For example, the computer readable storage medium 804 includes a semiconductor or solid-state memory, a magnetic tape, a removable computer diskette, a random access memory (RAM), a read-only memory (ROM), a rigid magnetic disk, and/or an optical disk. In some embodiments using optical disks, the computer readable storage medium 804 includes a compact disk-read only memory (CD-ROM), a compact disk-read/write (CD-R/W), and/or a digital video disc (DVD).

In some embodiments, the storage medium 804 stores the computer program code 806 configured to cause system 800 to perform method 600 or 700. In some embodiments, the storage medium 804 also stores information needed for performing method 600 or 700 as well as information generated during performing method 600 or 700, such as user interface 818, technology files 820, cell library 822, layout diagram 824 and fabrication tool 826, and/or a set of executable instructions to perform the operation of method 600 or 700. In some embodiments, layout diagram 824 comprises one or more of layout design 100 of FIG. 1, layout design 200A-200B of corresponding FIGS. 2A-2B, layout design 400A of FIG. 4A or layout design 500A of FIG. 5A.

In some embodiments, the storage medium 804 stores instructions (e.g., computer program code 806) for interfacing with manufacturing machines. The instructions (e.g., computer program code 806) enable processor 802 to generate manufacturing instructions readable by the manufacturing machines to effectively implement method 600 or 700 during a manufacturing process.

System 800 includes I/O interface 810. I/O interface 810 is coupled to external circuitry. In some embodiments, I/O interface 810 includes a keyboard, keypad, mouse, trackball, trackpad, and/or cursor direction keys for communicating information and commands to processor 802.

System 800 also includes network interface 812 coupled to the processor 802. Network interface 812 allows system 800 to communicate with network 814, to which one or more other computer systems are connected. Network interface 812 includes wireless network interfaces such as BLUETOOTH, WIFI, WIMAX, GPRS, or WCDMA; or wired network interface such as ETHERNET, USB, or IEEE-1394. In some embodiments, method 600 or 700 is implemented in two or more systems 800, and information such as user interface, technology files, cell library, and layout diagram are exchanged between different systems 800 by network 814. System 800 is configured to receive information related to a layout diagram through I/O interface 810 or network interface 812. The information is transferred to processor 802 by bus 808 to determine a layout design for producing at least integrated circuit 200C, 300A-300B, 400B or 500B. The layout diagram is then stored in computer readable medium 804 as layout design 824. System 800 is configured to receive information related to a user interface through I/O interface 810 or network interface 812. The information is stored in computer readable medium 804 as user interface 818. System 800 is configured to receive information related to technology files through I/O interface 810 or network interface 812. The information is stored in computer readable medium 804 as technology files 820. System 800 is configured to receive information related to a cell library through I/O interface 810 or network interface 812. The information is stored in computer readable medium 804 as cell library 822. System 800 is configured to receive information related to a fabrication tool through I/O interface 810 or network interface 812. The information is stored in computer readable medium 804 as fabrication tool 826. In some embodiments, the fabrication tool 826 includes fabrication information utilized by system 800. In some embodiments, the fabrication tool 826 corresponds to mask fabrication 934 of FIG. 9. In some embodiments, the fabrication tool 826 corresponds to fabricating a semiconductor wafer 942 of FIG. 9 by IC fab 940. In some embodiments, the fabrication tool 826 corresponds to fabricating a semiconductor wafer 942 of FIG. 9 by IC fab 940 to form IC device 960.

In some embodiments, method 600 or 700 is implemented as a standalone software application for execution by a processor. In some embodiments, method 600 or 700 is implemented as a software application that is a part of an additional software application. In some embodiments, method 600 or 700 is implemented as a plug-in to a software application. In some embodiments, method 600 or 700 is implemented as a software application that is a portion of an EDA tool. In some embodiments, method 600 or 700 is implemented as a software application that is used by an EDA tool. In some embodiments, the EDA tool is used to generate a layout diagram of the integrated circuit device. In some embodiments, the layout is stored on a non-transitory computer readable medium. In some embodiments, the layout is generated using a tool such as VIRTUOSO® available from CADENCE DESIGN SYSTEMS, Inc., or another suitable layout generating tool. In some embodiments, the layout is generated based on a netlist which is created based on the schematic design. In some embodiments, method 600 or 700 is implemented by a manufacturing device to manufacture an integrated circuit using a set of masks manufactured based on one or more layout designs generated by system 800. In some embodiments, system 800 a manufacturing device to manufacture an integrated circuit using a set of masks manufactured based on one or more layout designs of the present disclosure. In some embodiments, system 800 of FIG. 8 generates layout designs of an integrated circuit that are smaller than other approaches. In some embodiments, system 800 of FIG. 8 generates layout designs of integrated circuit structure that occupy less area and provide better routing resources than other approaches.

Figure 9:
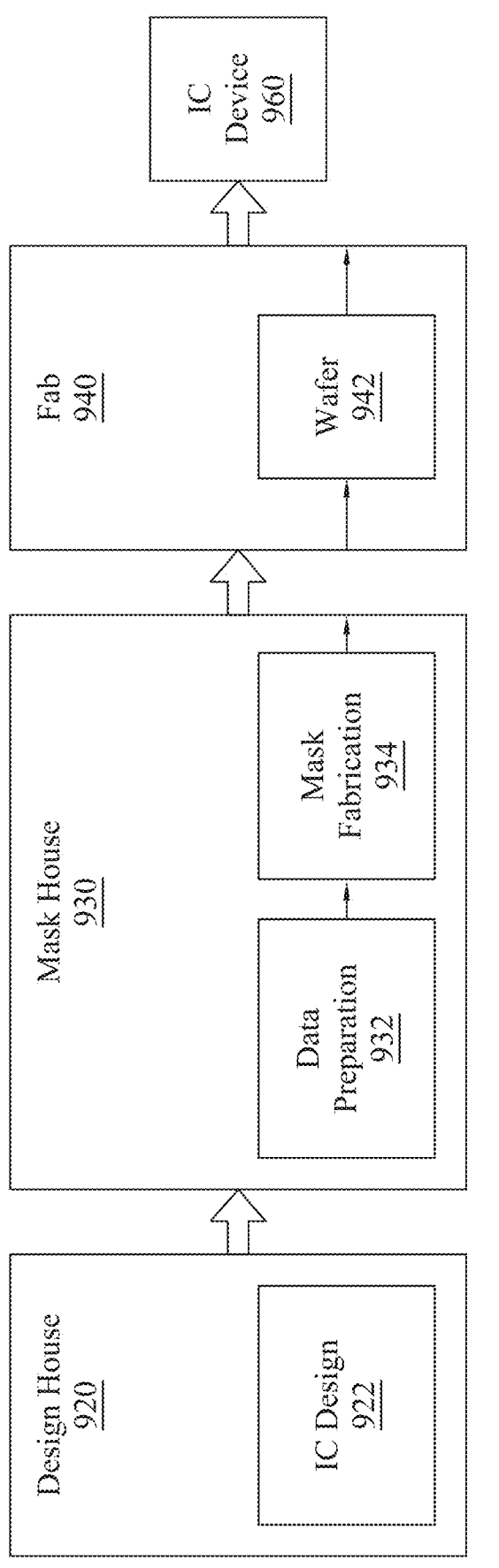
FIG. 9 is a block diagram of an integrated circuit (IC) manufacturing system, and an IC manufacturing flow associated therewith, in accordance with at least one embodiment of the present disclosure.

FIG. 9 is a block diagram of an integrated circuit (IC) manufacturing system 900, and an IC manufacturing flow associated therewith, in accordance with at least one embodiment of the present disclosure.

In FIG. 9, IC manufacturing system 900 includes entities, such as a design house 920, a mask house 930, and an IC manufacturer/fabricator ("fab") 940, that interact with one another in the design, development, and manufacturing cycles and/or services related to manufacturing an IC device 960. The entities in system 900 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of design house 920, mask house 930, and IC fab 940 is owned by a single larger company. In some embodiments, two or more of design house 920, mask house 930, and IC fab 940 coexist in a common facility and use common resources.

Design house (or design team) 920 generates an IC design layout 922. IC design layout 922 includes various geometrical patterns designed for an IC device 960. The geometrical patterns correspond to patterns of metal, oxide, or semiconductor layers that make up the various components of IC device 960 to be fabricated. The various layers combine to form various IC features. For example, a portion of IC design layout 922 includes various IC features, such as an active region, gate electrode, source electrode and drain electrode, metal lines or vias of an interlayer interconnection, and openings for bonding pads, to be formed in a semiconductor substrate (such as a silicon wafer) and various material layers disposed on the semiconductor substrate. Design house 920 implements a proper design procedure to form IC design layout 922. The design procedure includes one or more of logic design, physical design or place and route. IC design layout 922 is presented in one or more data files having information of the geometrical patterns. For example, IC design layout 922 can be expressed in a GDSII file format or DFII file format.

Mask house 930 includes data preparation 932 and mask fabrication 934. Mask house 930 uses IC design layout 922 to manufacture one or more masks to be used for fabricating the various layers of IC device 960 according to IC design layout 922. Mask house 930 performs mask data preparation 932, where IC design layout 922 is translated into a representative data file ("RDF"). Mask data preparation 932 provides the RDF to mask fabrication 934. Mask fabrication 934 includes a mask writer. A mask writer converts the RDF to an image on a substrate, such as a mask (reticle) or a semiconductor wafer. The design layout is manipulated by mask data preparation 932 to comply with particular characteristics of the mask writer and/or requirements of IC fab 940. In FIG. 9, mask data preparation 932 and mask fabrication 934 are illustrated as separate elements. In some embodiments, mask data preparation 932 and mask fabrication 934 can be collectively referred to as mask data preparation.

In some embodiments, mask data preparation 932 includes optical proximity correction (OPC) which uses lithography enhancement techniques to compensate for image errors, such as those that can arise from diffraction, interference, other process effects and the like. OPC adjusts IC design layout 922. In some embodiments, mask data preparation 932 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 932 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 934, which may undo part of the modifications performed by OPC in order to meet mask creation rules.

In some embodiments, mask data preparation 932 includes lithography process checking (LPC) that simulates processing that will be implemented by IC fab 940 to fabricate IC device 960. LPC simulates this processing based on IC design layout 922 to create a simulated manufactured device, such as IC device 960. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 922.

It should be understood that the above description of mask data preparation 932 has been simplified for the purposes of clarity. In some embodiments, data preparation 932 includes additional features such as a logic operation (LOP) to modify the IC design layout according to manufacturing rules. Additionally, the processes applied to IC design layout 922 during data preparation 932 may be executed in a variety of different orders.

After mask data preparation 932 and during mask fabrication 934, a mask or a group of masks are fabricated based on the modified IC design layout. In some embodiments, an electron-beam (e-beam) or a mechanism of multiple e-beams is used to form a pattern on a mask (photomask or reticle) based on the modified IC design layout. The mask can be formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask can be attenuated PSM or alternating PSM. The mask(s) generated by mask fabrication 934 is used in a variety of processes. For example, such a mask(s) is used in an ion implantation process to form various doped regions in the semiconductor wafer, in an etching process to form various etching regions in the semiconductor wafer, and/or in other suitable processes.

IC fab 940 is an IC fabrication business that includes one or more manufacturing facilities for the fabrication of a variety of different IC products. In some embodiments, IC Fab 940 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 940 uses the mask (or masks) fabricated by mask house 930 to fabricate IC device 960. Thus, IC fab 940 at least indirectly uses IC design layout 922 to fabricate IC device 960. In some embodiments, a semiconductor wafer 942 is fabricated by IC fab 940 using the mask (or masks) to form IC device 960. Semiconductor wafer 942 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 900 of FIG. 9), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

One aspect of this description relates to a method of forming an integrated circuit. In some embodiments, the method includes placing, by a processor, a first standard cell layout design of the integrated circuit on a layout design, the first standard cell layout design having a first height. In some embodiments, the placing the first standard cell layout design includes placing a first set of pin layout patterns on a first layout level and over a first set of gridlines, the first set of pin layout patterns extending in a first direction, and having a first width in a second direction different from the first direction, each gridline of the first set of gridlines is separated from an adjacent gridline of the first set of gridlines in the second direction by a first pitch of the first set of pin layout patterns. In some embodiments, the method further includes placing a second standard cell layout design of the integrated circuit adjacent to the first standard cell layout design, the second standard cell layout design having a second height different from the first height, the first height and the second height being in the second direction. In some embodiments, the placing the second standard cell layout design includes placing a second set of pin layout patterns on the first layout level and over a second set of gridlines, the second set of pin layout patterns extending in the first direction, and having a second width in the second direction, the second width being different from the first width, each gridline of the second set of gridlines is separated from an adjacent gridline of the second set of gridlines in the second direction by a second pitch of the second set of pin layout patterns, the second pitch being different from the first pitch. In some embodiments, the method further includes manufacturing the integrated circuit based on at least the first standard cell layout design or the second standard cell layout design.

Another aspect of this description relates to a system for manufacturing an integrated circuit. In some embodiments, the system includes a non-transitory computer readable medium configured to store non-transitory instructions, and a processor coupled to the non-transitory computer readable medium. In some embodiments, the processor is configured to execute the non-transitory instructions including generating, by a processor, a first standard cell layout design of the integrated circuit, and generating a second standard cell layout design of the integrated circuit. In some embodiments, the generating the first standard cell layout design includes generating a first set of pin layout patterns extending in a first direction, being on a first layout level, and having a first width in a second direction different from the first direction, and the first standard cell layout design having a first height in the second direction. In some embodiments, the generating the second standard cell layout design includes generating a second set of pin layout patterns extending in the first direction, being on the first layout level, and having a second width in the second direction different from the first width, and the second standard cell layout design having a second height in the second direction different from the first height, and the second standard cell layout design being adjacent to the first standard cell layout design.

Yet another aspect of this description relates to an integrated circuit. In some embodiments, the integrated circuit includes a first region of the integrated circuit including a first set of pins extending in a first direction, being on a first level, and having a first width in a second direction different from the first direction, wherein the first region has a first height in the second direction. In some embodiments, the integrated circuit further includes a second region of the integrated circuit adjacent to the first region, the second region including a second set of pins extending in the first direction, being on a first level, being separated from the first set of pins in the second direction, and having a second width in the second direction, the first width being different from the second width, wherein the second region has a second height in the second direction different from the first height, and the first level is a first metal layer of the integrated circuit.

A number of embodiments have been described. It will nevertheless be understood that various modifications may be made without departing from the spirit and scope of the disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logical value of various signals used in the above description is also for illustration. Various embodiments are not limited to a particular logical value when a signal is activated and/or deactivated. Selecting different logical values is within the scope of various embodiments. In various embodiments, a transistor functions as a switch. A switching circuit used in place of a transistor is within the scope of various embodiments. In various embodiments, a source of a transistor can be configured as a drain, and a drain can be configured as a source. As such, the term source and drain are used interchangeably. Various signals are generated by corresponding circuits, but, for simplicity, the circuits are not shown.

Various figures show capacitive circuits using discrete capacitors for illustration. Equivalent circuitry may be used. For example, a capacitive device, circuitry or network (e.g., a combination of capacitors, capacitive elements, devices, circuitry, or the like) can be used in place of the discrete capacitor. The above illustrations include exemplary operations or steps, but the steps are not necessarily performed in the order shown. Steps may be added, replaced, changed order, and/or eliminated as appropriate, in accordance with the spirit and scope of disclosed embodiments.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:

placing, by a processor, a first standard cell layout design of the integrated circuit on a layout design, the first standard cell layout design having a first height, the placing the first standard cell layout design includes:

placing a first set of pin layout patterns on a first layout level and over a first set of gridlines, the first set of pin layout patterns extending in a first direction, and having a first width in a second direction different from the first direction, each gridline of the first set of gridlines is separated from an adjacent gridline of the first set of gridlines in the second direction by a first pitch of the first set of pin layout patterns;

placing a second standard cell layout design of the integrated circuit adjacent to the first standard cell layout design, the second standard cell layout design having a second height different from the first height, the first height and the second height being in the second direction, the placing the second standard cell layout design includes:

placing a second set of pin layout patterns on the first layout level and over a second set of gridlines, the second set of pin layout patterns extending in the first direction, and having a second width in the second direction, the second width being different from the first width, each gridline of the second set of gridlines is separated from an adjacent gridline of the second set of gridlines in the second direction by a second pitch of the second set of pin layout patterns, the second pitch being different from the first pitch; and manufacturing the integrated circuit based on at least the first standard cell layout design or the second standard cell layout design.

2. The method of claim 1, wherein the placing the first standard cell layout design of the integrated circuit, further includes:

placing a first set of conductive feature layout patterns on a second layout level different from the first layout level, the first set of conductive feature layout patterns extending in the second direction, and overlapping at least the first set of pin layout patterns, and the placing the second standard cell layout design of the integrated circuit, further includes:

placing a second set of conductive feature layout patterns on the second layout level, the second set of conductive feature layout patterns extending in the second direction, and overlapping at least the second set of pin layout patterns.

3. The method of claim 2, wherein the placing the first standard cell layout design of the integrated circuit, further includes:

placing a first set of via layout patterns between the first set of pin layout patterns and the first set of conductive feature layout patterns, the first set of via layout patterns having a first via width in the first direction, and a first via height in the second direction; and the placing the second standard cell layout design of the integrated circuit, further includes:

placing a second set of via layout patterns between the second set of pin layout patterns and the second set of conductive feature layout patterns, the second set of via layout patterns having a second via width in the first direction, and a second via height in the second direction, and at least one of the second via width being different from the first via width, or the second via height being different from the first via height.

4. The method of claim 3, wherein the placing the first standard cell layout design of the integrated circuit, further includes:

placing a third set of conductive feature layout patterns on a third layout level and over a third set of gridlines, the third set of conductive feature layout patterns extending in the first direction, and overlapping at least the first set of conductive feature layout patterns, the third layout level being different from the first layout level and the second layout level, and the placing the second standard cell layout design of the integrated circuit, further includes:

placing a fourth set of conductive feature layout patterns on the third layout level and over a fourth set of gridlines, the fourth set of conductive feature layout patterns extending in the first direction, and overlapping at least the second set of conductive feature layout patterns.

5. The method of claim 4, wherein the placing the first standard cell layout design of the integrated circuit, further includes:

placing a third set of via layout patterns between the third set of conductive feature layout patterns and the first set of conductive feature layout patterns, the third set of via layout patterns having a third via width in the first direction, and a third via height in the second direction; and the placing the second standard cell layout design of the integrated circuit, further includes:

placing a fourth set of via layout patterns between the fourth set of conductive feature layout patterns and the second set of conductive feature layout patterns, the fourth set of via layout patterns having a fourth via width in the first direction, and a fourth via height in the second direction, and at least one of the fourth via width being different from the third via width, or the fourth via height being different from the third via height.

6. The method of claim 4, wherein the placing the first standard cell layout design of the integrated circuit, further includes:

placing a first set of active region layout patterns on a fourth layout level, the first set of active region layout patterns corresponding to fabricating a first set of active regions, the first set of active region layout patterns having a third width in the second direction, the fourth layout level being different from the first layout level, the second layout level and the third layout level; and the placing the second standard cell layout design of the integrated circuit, further includes:

placing a second set of active region layout patterns on the fourth layout level, the second set of active region layout patterns corresponding to fabricating a second set of active regions, the second set of active region layout patterns having a fourth width in the second direction different from the third width.

7. A system for manufacturing an integrated circuit, the system comprising:

a non-transitory computer readable medium configured to store non-transitory instructions; and a processor coupled to the non-transitory computer readable medium, wherein the processor is configured to execute the non-transitory instructions comprising:

generating a first standard cell layout design of the integrated circuit, the generating the first standard cell layout design includes:

generating a first set of pin layout patterns extending in a first direction, being on a first layout level, and having a first width in a second direction different from the first direction, and the first standard cell layout design having a first height in the second direction; and generating a second standard cell layout design of the integrated circuit, the generating the second standard cell layout design includes:

generating a second set of pin layout patterns extending in the first direction, being on the first layout level, and having a second width in the second direction different from the first width, and the second standard cell layout design having a second height in the second direction different from the first height, and the second standard cell layout design being adjacent to the first standard cell layout design.

8. The system of claim 7, wherein each pin layout pattern of the first set of pin layout patterns is separated from an adjacent pin layout pattern of the first set of pin layout patterns in the second direction by a first pitch; and each pin layout pattern of the second set of pin layout patterns is separated from an adjacent pin layout pattern of the second set of pin layout patterns in the second direction by a second pitch different from the first pitch.

9. The system of claim 7, wherein the generating the first standard cell layout design of the integrated circuit, further includes:

generating a first set of via layout patterns corresponding to fabricating a first set of vias, the first set of via layout patterns having a first size, and being placed on the first set of pin layout patterns; and the generating the second standard cell layout design of the integrated circuit, further includes:

generating a second set of via layout patterns corresponding to fabricating a second set of vias, the second set of pin layout patterns having a second size different from the first size, and being placed on the second set of pin layout patterns.

10. The system of claim 9, wherein the first size includes at least a first via pattern width or a first via pattern height; and the second size includes at least a second via pattern width different from the first via pattern width, or a second via pattern height different from the first via pattern height.

11. The system of claim 7, wherein the generating the first standard cell layout design of the integrated circuit, further includes:

generating a first set of conductive feature layout patterns corresponding to fabricating a first set of conductive structures, the first set of conductive feature layout patterns extending in the second direction, overlapping at least the first set of pin layout patterns, and being on a second layout level different from the first layout level; and the generating the second standard cell layout design of the integrated circuit, further includes:

generating a second set of conductive feature layout patterns corresponding to fabricating a second set of conductive structures, the second set of conductive feature layout patterns extending in the second direction, overlapping at least the second set of pin layout patterns, and being on the second layout level.

12. The system of claim 11, wherein the generating the first standard cell layout design of the integrated circuit, further includes:

generating a third set of conductive feature layout patterns corresponding to fabricating a third set of conductive structures, the third set of conductive feature layout patterns extending in the first direction, overlapping at least the first set of conductive feature layout patterns, and being on a third layout level different from the first layout level and the second layout level; and the generating the second standard cell layout design of the integrated circuit, further includes:

generating a fourth set of conductive feature layout patterns corresponding to fabricating a fourth set of conductive structures, the fourth set of conductive feature layout patterns extending in the first direction, overlapping at least the second set of conductive feature layout patterns, and being on the third layout level.

13. The system of claim 12, wherein the generating the first standard cell layout design of the integrated circuit, further includes:

generating a first set of via layout patterns corresponding to fabricating a first set of vias, the first set of via layout patterns having a first size, and being placed between the first set of conductive feature layout patterns and the third set of conductive feature layout patterns; and the generating the second standard cell layout design of the integrated circuit, further includes:

generating a second set of via layout patterns corresponding to fabricating a second set of vias, the second set of via layout patterns having a second size, and being placed between the second set of conductive feature layout patterns and the fourth set of conductive feature layout patterns.

14. The system of claim 13, wherein the first size includes at least a first via pattern width or a first via pattern height; and the second size includes at least a second via pattern width different from the first via pattern width, or a second via pattern height different from the first via pattern height.

15. The system of claim 12, wherein each conductive feature layout pattern of the third set of conductive feature layout patterns is separated from an adjacent conductive feature layout pattern of the third set of conductive feature layout patterns in the second direction by a first pitch; and each conductive feature layout pattern of the fourth set of conductive feature layout patterns is separated from an adjacent conductive feature layout pattern of the fourth set of conductive feature layout patterns in the second direction by a second pitch different from the first pitch.

16. The system of claim 7, wherein the generating the first standard cell layout design of the integrated circuit, further includes:

generating a first set of active region layout patterns corresponding to fabricating a first set of active regions, the first set of active region layout patterns having a third width in the second direction, and being placed on a second layout level different from the first layout level; and the generating the second standard cell layout design of the integrated circuit, further includes:

generating a second set of active region layout patterns corresponding to fabricating a second set of active regions, the second set of active region layout patterns having a fourth width in the second direction different from the third width, and being placed on the second layout level.

17. A method of forming an integrated circuit, the method comprising:

placing, by a processor, a first standard cell layout design of the integrated circuit on a layout design, the first standard cell layout design having a first height, the placing the first standard cell layout design includes:

placing a first set of pin layout patterns on a first layout level and over a first set of gridlines, the first set of pin layout patterns extending in a first direction, and having a first width in a second direction different from the first direction, each gridline of the first set of gridlines is separated from an adjacent gridline of the first set of gridlines in the second direction by a first pitch of the first set of pin layout patterns;

generating a second standard cell layout design of the integrated circuit, the generating the second standard cell layout design includes:

generating a second set of pin layout patterns extending in the first direction, being on the first layout level, and over a second set of gridlines, and having a second width in the second direction different from the first width, and the second standard cell layout design having a second height different from the first height, the first height and the second height being in the second direction, and the second standard cell layout design being adjacent to the first standard cell layout design; and manufacturing the integrated circuit based on at least the first standard cell layout design or the second standard cell layout design.

18. The method of claim 17, wherein
the placing the first standard cell layout design of the
integrated circuit, further includes:
   placing a first set of conductive feature layout patterns
   on a second layout level different from the first
   layout level, the first set of conductive feature layout
   patterns extending in the second direction, and over-
   lapping at least the first set of pin layout patterns, and
the generating the second standard cell layout design of
the integrated circuit, further includes:
   generating a second set of conductive feature layout
   patterns extending in the second direction, overlap-
   ping at least the second set of pin layout patterns, and
   being on the second layout level.

19. The method of claim 18, wherein
the placing the first standard cell layout design of the
integrated circuit, further includes:
   placing a first set of via layout patterns between the first
   set of pin layout patterns and the first set of conduc-
   tive feature layout patterns, the first set of via layout
   patterns having a first via width in the first direction,
   and a first via height in the second direction; and
the generating the second standard cell layout design of
the integrated circuit, further includes:
   generating a second set of via layout patterns having a
   second via width in the first direction, and a second via height in the second direction, and at least one of
   the second via width being different from the first via
   width, or the second via height being different from
   the first via height, the second set of via layout
   patterns being between the second set of pin layout
   patterns and the second set of conductive feature
   layout patterns.

20. The method of claim 19, wherein
the placing the first standard cell layout design of the
integrated circuit, further includes:
   placing a third set of conductive feature layout patterns
   on a third layout level and over a third set of
   gridlines, the third set of conductive feature layout
   patterns extending in the first direction, and overlap-
   ping at least the first set of conductive feature layout
   patterns, the third layout level being different from
   the first layout level and the second layout level, and
the generating the second standard cell layout design of
the integrated circuit, further includes:
   generating a fourth set of conductive feature layout
   patterns extending in the first direction, overlapping
   at least the second set of conductive feature layout
   patterns, and being on the third layout level and over
   a fourth set of gridlines.

* * * * *